US005935758A

United States Patent [19]

Patel et al.

[11] Patent Number: 5,935,758

[45] Date of Patent: Aug. 10, 1999

[54] LASER INDUCED FILM TRANSFER SYSTEM

[75] Inventors: Ranjan C. Patel, Little Hallingbury; Mark R. I. Chambers, London; Dian E. Stevenson, Saffron Walden; Jonathan C. Vogel, Essex, all of United Kingdom; Kevin Kidnie, Saint Paul; John Souter, Orono, both of Minn.; Gregory L. Zwaldo, Ellsworth, Wis.

[73] Assignee: Imation Corp., Oakdale, Minn.

[21] Appl. No.: 08/842,151

[22] Filed: Apr. 22, 1997

Related U.S. Application Data

[63] Continuation-in-part of application No. 08/619,448, Mar. 19, 1996, abandoned.

[30] Foreign Application Priority Data

| | | | |
|---|---|---|---|
| Apr. 20, 1995 | [GB] | United Kingdom | 9508027 |
| Aug. 20, 1996 | [GB] | United Kingdom | 17414 |
| Aug. 20, 1996 | [GB] | United Kingdom | 17416 |

[51] Int. Cl.[6] .................. G03F 7/34; G03F 7/40

[52] U.S. Cl. .................. 430/200; 430/270.1; 430/339; 430/927; 430/920; 430/944; 430/964

[58] Field of Search .................. 430/200, 201, 430/339, 944, 964, 920, 927, 270.1

[56] References Cited

U.S. PATENT DOCUMENTS

| | | | |
|---|---|---|---|
| 2,701,245 | 2/1955 | Lynn | 260/89.5 |
| 2,890,969 | 6/1959 | Shossberger et al. | 117/36 |
| 3,129,661 | 4/1964 | Newman | 101/149.2 |
| 3,787,210 | 1/1974 | Roberts | 96/27 E |
| 3,852,093 | 12/1974 | O'Leary | 117/36.8 |
| 3,964,389 | 6/1976 | Peterson | 101/467 |
| 4,190,321 | 2/1980 | Dorer et al. | 350/165 |
| 4,252,843 | 2/1981 | Dorer et al. | 427/162 |
| 4,340,276 | 7/1982 | Maffitt et al. | 350/164 |
| 4,343,891 | 8/1982 | Aasen et al. | 430/337 |
| 4,447,521 | 5/1984 | Tiers et al. | 430/337 |
| 4,501,808 | 2/1985 | Sakai et al. | 430/59 |
| 4,514,493 | 4/1985 | Hirai et al. | 430/617 |
| 4,529,684 | 7/1985 | Sasagawa et al. | 430/269 |
| 4,540,618 | 9/1985 | Suzuki et al. | 428/141 |

(List continued on next page.)

FOREIGN PATENT DOCUMENTS

| | | | |
|---|---|---|---|
| 0 040 978 | 12/1981 | European Pat. Off. | G03C 5/38 |
| 0 109 295 | 11/1983 | European Pat. Off. | B41M 5/26 |
| 0 109 772 | 5/1984 | European Pat. Off. | G03C 7/02 |
| 0 120 601 | 10/1984 | European Pat. Off. | G03C 7/02 |
| 0 163 297 | 5/1985 | European Pat. Off. | B41M 5/26 |
| 0 174 054 | 3/1986 | European Pat. Off. | B41M 5/26 |
| 0 382 420 | 2/1990 | European Pat. Off. | B29C 35/08 |
| 0 403 157 | 6/1990 | European Pat. Off. | G03C 1/498 |
| 0 454 083 | 4/1991 | European Pat. Off. | B41M 5/34 |
| 0 462 763 | 12/1991 | European Pat. Off. | G03C 7/02 |
| 0 530 018 | 8/1992 | European Pat. Off. | B41M 5/40 |
| 0 515 133 | 11/1992 | European Pat. Off. | C07C 311/82 |
| 0 544 284 | 11/1992 | European Pat. Off. | B41M 5/40 |
| 0 566 103 | 4/1993 | European Pat. Off. | B41M 5/40 |
| 0 593 364 | 10/1993 | European Pat. Off. | B41J 2/48 |
| 0 602 893 | 12/1993 | European Pat. Off. | B41M 5/38 |
| 0 675 003 | 3/1995 | European Pat. Off. | B41M 5/38 |
| 0 679 532 | 4/1995 | European Pat. Off. | B41M 5/38 |
| 0 681 210 | 11/1995 | European Pat. Off. | G03C 1/498 |
| 0 302 610 | 2/1996 | European Pat. Off. | B03C 7/02 |
| 0 738 930 | 4/1996 | European Pat. Off. | G03F 7/095 |
| 0 722 828 | 7/1996 | European Pat. Off. | B41C 1/10 |
| 0 751 008 | 7/1996 | European Pat. Off. | B41M 5/40 |
| 0 739 748 | 10/1996 | European Pat. Off. | B41M 5/30 |

(List continued on next page.)

OTHER PUBLICATIONS

S. Chatterjee et al., "Electron–Transfer Reactions in Cyanine Borate Ion Pairs: Photopolymerization Initiators Sensitive to Visible Light", *J. Am. Chem. Soc.*, 110, 2326–2328 (1988).

M.L. Levene et al., "Material Transfer Recording", *Applied Optics*, 9(10) 2260–2265 (1970).

M. Matsuoka et al., "Photoreduction of Cyanine Borate Infrared Absorbing Dyes", *J. Chem. Soc., Chem. Commun.*, 299–301 (1993).

C. Pac et al., "$Ru(bpy)_3^{2+}$–Mediated Photoreduction of Olefins with 1–Benzyl–1,4–dihydronicotinamide: A Mechanistic NAD(P)H–Model Compounds[1]", *Amer. Chem. Soc.*, 103, 6495–6497 (1981).

D. Teegarden et al., "Contrast Enhancement Lithography System Based on Pyrylium Dye Bleach Chemistry", *J. Imag. Sci. Tech.*, 37, 149–155 (1993).

X. Zhang et al., "Laser–Initiated Synthesis: 2,4,5, 7–Tetraiodo–6–hydroxy–3–fluorone as a Visible Photoinitiator", *J. Org. Chem.* , 58, 2614–2618 (1993).

S. Chatterjee et al., "Photochemistry of Carbocyanine Alkyltriphenylborate Salts: Intra–Ion–Pair Electron Transfer and the Chemistry of Boranyl Radicals", *J. Am. Chem. Soc.*, 112, pp. 6329–6338 (1990).

I. Lee et al., "Direct measurement of polymer temperature during laser ablation using amolecular thermometer", *J. Appl., Phys.*, 72, 2440–2448 (1992).

I. Lee et al., "Dynamics of Laser Ablation Transfer Imaging Investigated by Ultrafast Microscopy", *J. Imag. Sci. Tech.*, 36, 180–187 (1992).

G. Pinto, "Dynamics of Laser Ablation Transfer Thermal Imaging: Fundamental Mechanisms Investigated by SIMS Surface Analysis", *J. Imag. Sci. Tech.*, 38, 565–570 (1994).

R. Srinivasan et al., "Ultraviolet Laser Ablation of Organic Polymers", *Chem. Rev.*, 89, 1303–1316 (1989).

(List continued on next page.)

*Primary Examiner*—Richard L. Schilling
*Attorney, Agent, or Firm*—William D. Bauer

[57] ABSTRACT

A laser-induced thermal imaging system having a donor element and a receptor element. The donor element includes a substrate on which is coated transfer material that includes: a binder including a hydroxylic resin; a fluorocarbon additive; a cationic infrared absorbing dye; a dihydropyridine latent crosslinking agent; and a dispersible material. The receptor element comprises a texturized surface.

48 Claims, No Drawings

U.S. PATENT DOCUMENTS

| | | | |
|---|---|---|---|
| 4,541,830 | 9/1985 | Hotta et al. | 8/471 |
| 4,588,674 | 5/1986 | Stewart et al. | 430/272 |
| 4,602,263 | 7/1986 | Borror et al. | 346/201 |
| 4,615,938 | 10/1986 | Hotta et al. | 428/323 |
| 4,626,493 | 12/1986 | Hutters et al. | 430/201 |
| 4,634,652 | 1/1987 | Barton | 430/156 |
| 4,663,269 | 5/1987 | Narang et al. | 430/326 |
| 4,701,402 | 10/1987 | Patel et al. | 430/332 |
| 4,711,834 | 12/1987 | Butters et al. | 430/201 |
| 4,720,450 | 1/1988 | Ellis | 430/339 |
| 4,769,459 | 9/1988 | Patel et al. | 544/301 |
| 4,772,582 | 9/1988 | DeBoer | 503/227 |
| 4,777,159 | 10/1988 | Taguchi et al. | 503/227 |
| 4,788,128 | 11/1988 | Barlow | 430/200 |
| 4,816,378 | 3/1989 | Powers et al. | 430/301 |
| 4,816,379 | 3/1989 | Bronstert et al. | 430/306 |
| 4,819,010 | 4/1989 | Kohashi et al. | 346/76 PH |
| 4,826,717 | 5/1989 | Kohnshi et al. | 428/143 |
| 4,826,976 | 5/1989 | Borror et al. | 544/58.4 |
| 4,857,431 | 8/1989 | Kato et al. | 430/91 |
| 4,876,235 | 10/1989 | DeBoer | 503/227 |
| 4,885,225 | 12/1989 | Heller et al. | 430/160 |
| 4,897,310 | 1/1990 | Beyer et al. | 428/412 |
| 4,950,639 | 8/1990 | DeBoer et al. | 503/227 |
| 4,973,572 | 11/1990 | DeBoer | 503/227 |
| 5,017,547 | 5/1991 | DeBoer | 503/227 |
| 5,019,549 | 5/1991 | Kellogg et al. | 503/227 |
| 5,034,371 | 7/1991 | Tanaka et al. | 503/227 |
| 5,053,381 | 10/1991 | Chapman et al. | 503/227 |
| 5,064,743 | 11/1991 | Koshizuka et al. | 430/253 |
| 5,089,372 | 2/1992 | Kirihata et al. | 430/167 |
| 5,126,760 | 6/1992 | DeBoer | 346/108 |
| 5,135,842 | 8/1992 | Kitchin et al. | 430/510 |
| 5,153,104 | 10/1992 | Rossman et al. | 430/339 |
| 5,153,105 | 10/1992 | Sher et al. | 430/339 |
| 5,156,938 | 10/1992 | Foley et al. | 430/200 |
| 5,166,041 | 11/1992 | Murofushi et al. | 430/339 |
| 5,171,650 | 12/1992 | Ellis et al. | 430/20 |
| 5,219,703 | 6/1993 | Bugner et al. | 430/200 |
| 5,232,817 | 8/1993 | Kawakami et al. | 430/201 |
| 5,238,736 | 8/1993 | Taeng et al. | 428/327 |
| 5,238,778 | 8/1993 | Hirai et al. | 430/200 |
| 5,246,909 | 9/1993 | Thien et al. | 503/227 |
| 5,254,524 | 10/1993 | Guittard et al. | 503/227 |
| 5,256,506 | 10/1993 | Ellis et al. | 430/20 |
| 5,266,452 | 11/1993 | Kitchin et al. | 430/510 |
| 5,278,576 | 1/1994 | Kaszczuk et al. | 346/1.1 |
| 5,306,686 | 4/1994 | Patel et al. | 503/200 |
| 5,310,595 | 5/1994 | Ali et al. | 428/206 |
| 5,314,795 | 5/1994 | Helland et al. | 430/517 |
| 5,329,300 | 7/1994 | Nishiyama | 346/108 |
| 5,352,562 | 10/1994 | Takahashi et al. | 430/253 |
| 5,380,644 | 1/1995 | Yonkoski et al. | 430/617 |
| 5,395,729 | 3/1995 | Reardon et al. | 430/200 |
| 5,395,747 | 3/1995 | Helland et al. | 430/510 |
| 5,399,459 | 3/1995 | Simpson et al. | 430/270 |
| 5,401,606 | 3/1995 | Reardon et al. | 430/200 |
| 5,441,794 | 8/1995 | Hitomi et al. | 428/195 |
| 5,468,603 | 11/1995 | Kub | 430/619 |
| 5,475,418 | 12/1995 | Patel et al. | 347/256 |
| 5,501,937 | 3/1996 | Matsumoto et al. | 430/200 |
| 5,516,622 | 5/1996 | Savini et al. | 430/200 |
| 5,518,861 | 5/1996 | Coveleskie et al. | 430/200 |
| 5,521,035 | 5/1996 | Wolk et al. | 430/20 |
| 5,563,019 | 10/1996 | Blanchet-Fincher | 430/200 |
| 5,580,693 | 12/1996 | Nakajima et al. | 430/200 |
| 5,593,808 | 1/1997 | Ellis | 430/261 |
| 5,622,795 | 4/1997 | Ellis | 430/201 |
| 5,633,113 | 5/1997 | Ellis | 430/201 |
| 5,663,033 | 9/1997 | Warner et al. | 430/257 |
| 5,705,314 | 1/1998 | Kapusniak et al. | 430/207 |
| 5,757,313 | 5/1998 | Meneghini et al. | 347/262 |
| 5,773,188 | 6/1998 | Eillis | 430/201 |

FOREIGN PATENT DOCUMENTS

| | | | |
|---|---|---|---|
| 46-3710 | 1/1971 | Japan . | |
| 51-88016 | 1/1975 | Japan | G03C 1/72 |
| 56-46789 | 4/1981 | Japan | B41M 5/26 |
| 63-319191 | 12/1981 | Japan | B41M 5/26 |
| 63-319192 | 12/1981 | Japan | B41M 5/26 |
| 59-101398 | 6/1984 | Japan | B41M 5/26 |
| 59-133098 | 7/1984 | Japan | B41M 5/26 |
| 57-014095 | 1/1985 | Japan | B41M 5/18 |
| 60-234888 | 11/1985 | Japan | B41M 5/26 |
| 61-137790 | 6/1986 | Japan | B41M 5/26 |
| 61-206691 | 12/1986 | Japan | B41M 5/26 |
| 61-291184 | 12/1986 | Japan | B41M 5/26 |
| 62-140884 | 6/1987 | Japan | B41M 5/26 |
| 63-022684 | 1/1988 | Japan | B41M 5/26 |
| 63-161445 | 7/1988 | Japan | G03C 1/00 |
| 63-185680 | 8/1988 | Japan | B41M 5/26 |
| 54-1589 | 1/1989 | Japan | B41M 5/26 |
| 04-327982 | 3/1991 | Japan | B41M 3/12 |
| 05-139036 | 6/1993 | Japan | B41M 5/26 |
| 08-267943 | 10/1996 | Japan | B41M 5/40 |
| 08-267944 | 10/1996 | Japan | B41M 5/40 |
| 08-290675 | 11/1996 | Japan | B41M 5/26 |
| 1 370 058 | 12/1972 | United Kingdom | G03C 1/72 |
| 1 386 269 | 12/1972 | United Kingdom | G03C 1/72 |
| 1 399 958 | 12/1973 | United Kingdom | B41M 5/26 |
| 2 083 726 | 3/1982 | United Kingdom | H04N 1/22 |
| 2 176 018 | 12/1986 | United Kingdom | B41M 5/26 |
| WO 88/04237 | 6/1988 | WIPO | B41M 5/26 |
| WO 90/12342 | 10/1990 | WIPO | G03C 1/492 |
| WO 93/03928 | 3/1993 | WIPO | B41M 5/40 |
| WO 93/04411 | 3/1993 | WIPO | G03G 17/10 |
| WO 94/04368 | 3/1994 | WIPO | B41M 5/26 |
| WO 95/05623 | 2/1995 | WIPO | G03C 3/00 |
| WO 95/13195 | 5/1995 | WIPO | B41M 5/38 |
| WO 96/34767 | 11/1996 | WIPO | B41M 5/38 |

OTHER PUBLICATIONS

W. Tolbert et al., "High–Speed Color Imaging by Laser Ablation Transfer with a Dynamic Release Layer: Fundamental Mechanisms", *J. Imag. Sci. Tech.*, 37, 411–421 (1993).

W. Tolbert et al., "Laser Ablation Transfer Imaging Using Picosecond Optical Pulses: Ultra–High Speed, Lower Threshold and High Resolution", *J. Imag. Sci. Tech.*, 37 485–489 (1993).

W. Tolbert et al., "Ultrafast Dynamics of Photothermal Polymer Ablation", *American Institute of Physics, AIP Conf. Proceedings 288*, 559–568 (Apr. 1993).

X. Wen et al., "Multiphonon up–pumping and molecular hot spots in superheated polymers studied by ultrafast optical calorimetry", *Chem. Phys. Ltrs.*, 192, 315–320 (1992).

J. Yeh, "Laser ablation of polymers", *J. Vac. Sci. Tech.*, 4, 653–658 (1986).

S. Chen et al., "Applications of Ultrafast Temperature Jump Spectroscopy to Condensed Phase Molecular Dynamics", *J. Phys. Chem.*, 96, 7178–7186 (1992).

T.J. Chuang, "Laser–Photoetching Characteristics of Polymers with Dopants", *Applied Physics A*, 45, 277–288 (1988).

D. Dlott, "Ultrafast microscopy and ultrafast calorimetry studies of laser polymer ablation", *20$^{th}$ Int'l Congress—SPIE, 1801*, 870–879 (1992).

D. Hare et al., "Fundamental Mechanisms of Laser Ablation Transfer Imaging", *IS&T's Tenth Int'l Congress on Advances in Non–Impact Printing Technologies*, 314–316 (1994).

D. Hare et al., "Highly time–and space–resolved studies of superfast image production using laser ablation transfer", *Microchemistry*, 123–135 (1994).

LASER INDUCED FILM TRANSFER SYSTEM

CROSS-REFERENCE TO RELATED APPLICATIONS

The present application is a Continuation-In-Part of U.S. patent Application Ser. No. 08/619,448, filed on Mar. 19, 1996, now abandoned the complete disclosure of which is incorporated herein by reference.

FIELD OF THE INVENTION

The present invention is directed to the formation of half tone color proofs using a laser-induced thermal imaging system. More specifically, the system of the present invention involves the mass transfer of a color half tone image from a donor element to a receptor element under the influence of the energy supplied by a laser.

BACKGROUND OF THE INVENTION

The present invention is directed to the formation of color proofs. In general, the image in a color proof is formed by transferring a colorant (e.g., dye or pigment) from a donor to a receptor under the influence of energy from a thermal printhead or a laser. This transfer can occur via mass transfer or dye transfer.

In a mass transfer system, the majority of the material on the donor (e.g., colorant, binder, and additives) is transferred to the receptor. Typically, this can occur either by a melt mechanism or by an ablation (i.e., ablative) mechanism. In a melt mechanism, the donor material is softened or melted. This softened or molten material then flows across to the receptor. This is typically the mechanism at work in a conventional, thermally induced wax transfer system. In an ablation mechanism, gases are typically generated that explosively propel the donor material across to the receptor. This results from at least partially volatilizing the binder or other additives in and/or under a layer of the donor material to generate propulsive forces to propel the colorant toward the receptor.

In a dye transfer system, however, only the colorant is transferred from the donor to the receptor. That is, the colorant is transferred without binder or other additives. This can occur either by a diffusion mechanism or a sublimation mechanism.

The image in a color proof formed from a mass transfer system is typically a half tone image. In a system that forms half tone images, the transfer gives a bi-level image in which either zero or a predetermined density level is transferred in the form of discrete dots (i.e., pixels). These dots can be randomly or regularly spaced per unit area, but are normally too small to be resolved by the naked eye. Thus, the perceived optical density in a half tone image is controlled by the size and the number of discrete dots per unit area. The smaller the fraction of a unit area covered by the dots, the less dense the image will appear to an observer.

The image in a color proof formed from a thermal dye transfer system is typically a continuous tone (i.e., contone) image. In a continuous tone or contone image, the perceived optical density is a function of the quantity of colorant per pixel, higher densities being obtained by transferring greater amounts of colorant.

To emulate half tone images using a thermal dye transfer system, which typically forms a contone image, the laser beam can be modulated by electronic signals which are representative of the shape and color of the original image, so that each dye is heated to cause volatilization only in those areas in which its presence is required on the receptor to reconstruct the color of the original object. Further details of this process are disclosed in GB Publication No. 2,083,726 (3M Company). U.S. Pat. Nos. 4,876,235 (DeBoer) and 5,017,547 (De Boer) also disclose a thermal dye transfer system in which the perceived optical density is obtained by controlling the tonal gradation or thickness (density) of the colorant per pixel. In this system, the receptor includes spacer beads to prevent contact between the donor and receptor elements. This allows for the dye to diffuse or sublime across to the receptor element without the binder.

The shape and/or definition of the dots can effect the quality of the image. For example, dots with more well-defined and sharper edges will provide images with more reproducible and accurate colors. The shape and/or definition of the dots are typically controlled by the mechanism of transfer of the image from the donor to the receptor. For example, as a result of the propulsive forces in an ablative system, there is a tendency for the colorant to "scatter" and produce less well-defined dots made of many fragments. Attempts have been made to produce more well-defined dots using an ablative system described in U.S. Pat. Nos. 5,156,938 (Foley) and 5,171,650 (Ellis); however, whether single layer or dual layer, such systems do not produce contract-quality images. In contrast, systems involving the transfer of molten or softened material can in principle form more well-defined dots.

For imaging by means of laser-induced transfer, the donor element typically includes a support bearing, in one or more coated layers, an absorber for the laser radiation, a transferrable colorant (e.g., one or more dyes or pigments), and one or more binder materials. When the donor element is placed in contact with a suitable receptor and subjected to a pattern of laser irradiation, absorption of the laser radiation causes rapid build-up of heat within the donor element, sufficient to cause transfer of colorant to the receptor in irradiated areas. By repeating the transfer process using different donor elements and the same receptor, it is possible to superimpose several monochrome images on a common receptor, thereby generating a full color image. This process is ideally suited to the output of digitally stored image information. It has the additional benefits of not requiring chemical processing and of not employing materials that are sensitive to normal white light.

As discussed above, laser-induced transfer can involve either mass transfer of the binder, colorants, and infrared absorber, giving a bi-level image in which either zero or maximum density is transferred (depending on whether the applied energy exceeds a given threshold), or dye sublimation transfer, giving a continuous tone image (in which the density of the transferred image varies over a significant range with the energy absorbed). Laser-induced mass transfer has been characterized in the literature, in *Applied Optics*, 9, 2260–2265 (1970), for example, as occurring via two different modes. One mode involves a less energetic mode in which transfer occurs in a fluid state (i.e., by melt transfer), and one mode involves a more energetic mode in which transfer occurs by an explosive force, as a result of generation and rapid expansion of gases at the substrate-coating interface (i.e., by ablation transfer). This distinction has also been recognized in U.S. Pat. Nos. 5,156,938 (Foley), 5,171,650 (Ellis), 5,516,622 (Savini), and 5,518,861 (Covalaskie), which refer to ablation transfer as a process distinct from melt transfer, and refer to its explosive nature, as opposed to U.S. Pat. Nos. 5,501,937 (Matsumoto), 5,401,606 (Reardon), 5,019,549 (Kellogg), and 5,580,693

(Nakajima), which refer to transfer of a colorant in a molten or semi-molten (softened) state, with no mention of explosive mechanisms.

Many of the known laser-induced melt transfer systems employ one or more waxes as binder materials, in pursuit of a transfer layer that melts sharply to a highly fluid state at moderately elevated temperatures, and hence gives a higher sensitivity; however, such systems are prone to image spread as a result of wicking or uncontrolled flow of the molten transfer material. Furthermore, because the laser absorber is normally transferred along with the desired colorant, the final image may lack the accuracy of color rendition required for high quality proofing purposes. Others have attempted to increase the sensitivity by adding plasticizers (see, e.g., U.S. Pat. No. 5,401,606 (Reardon)), which lowers the melt viscosity and increases the flow; however, such additives soften the films such that they become receptive to impressions and blocking, for example.

Thus, there is still a need for a laser-induced thermal transfer system that provides a half tone image in the form of discrete dots having well-defined, generally continuous edges that are relatively sharp with respect to density or edge definition (i.e., not feathered).

SUMMARY OF THE INVENTION

The present invention provides a laser-induced thermal imaging system comprising:

a donor element comprising a substrate on which is coated transfer material comprising:

a binder comprising a hydroxylic resin;

a fluorocarbon additive;

a cationic infrared absorbing dye;

a latent crosslinking agent having the following formula:

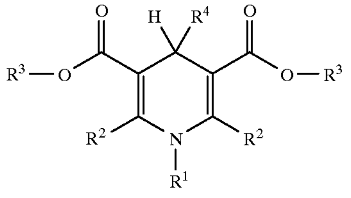

wherein $R^1$ is H or an organic group;

each $R^2$ and $R^3$ is an organic group; and $R^4$ is an aryl group;

a dispersible material; and a receptor element comprising a texturized surface.

Also provided is a laser-induced thermal imaging system comprising:

a donor element comprising a substrate on which is coated transfer material comprising:

a binder comprising a hydroxylic resin;

a fluorocarbon additive;

a tetraarylpolymethine dye of the formula:

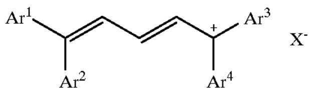

wherein each $Ar^1$ to $Ar^4$ are aryl groups that are the same or different and at least one of the aryl groups represented by $Ar^1$ to $Ar^4$ has a tertiary amino substituent, and X is an anion;

a latent crosslinking agent having the following formula:

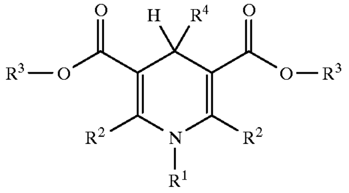

wherein $R^1$ is H or an organic group;

each $R^2$ and $R^3$ is an organic group; and $R^4$ is an aryl group; and a pigment; and a receptor element comprising a substrate on which is coated a receiving layer, wherein the receiving layer comprises:

a bleaching agent for the tetraarylpolymethine dye;

a binder; and particulate material.

Another aspect of the invention is a method of imaging comprising:

(a) providing a laser thermal transfer donor element comprising a substrate on which is coated transfer material comprising:

a binder comprising a hydroxylic resin;

a fluorocarbon additive;

a cationic infrared absorbing dye;

a latent crosslinking agent having of the following formula:

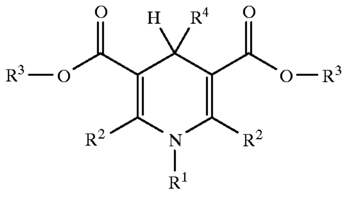

wherein $R^1$ is H or an organic group;

each $R^2$ and $R^3$ is an organic group; and $R^4$ is an aryl group; and a dispersible material;

(b) providing a receptor element having texturized surface;

(c) assembling the donor element in contact with the receptor element and exposing the assembly to scanned laser radiation of a wavelength absorbed by the cationic infrared absorbing dye, said laser radiation being modulated in accordance with digitally stored image information, thereby transferring portions of the transfer material from the donor element to the receptor element; and (d) separating the donor element and receptor element, leaving an image residing on the receptor element.

A further aspect of the invention is a method of imaging comprising:

(a) providing a laser thermal transfer donor element comprising a substrate on which is coated transfer material comprising:

a binder comprising a hydroxylic resin;

a fluorocarbon additive;

a cationic infrared absorbing dye;

a latent crosslinking agent having of the following formula:

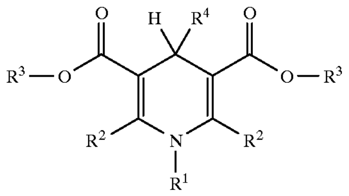

wherein $R^1$ is H or an organic group;
each $R^2$ and $R^3$ is an organic group; and
$R^4$ is an aryl group; and
a dispersible material;

(b) providing a receptor element having texturized surface;

(c) assembling the donor element in contact with the receptor element and exposing the assembly to scanned laser radiation of a wavelength absorbed by the cationic infrared absorbing dye, said laser radiation being focused to a spot of area A $\mu m^2$ at the plane of the transfer material and being modulated in accordance with digitally half tone image information, thereby causing exposed portions of the colorant layer to soften or melt and adhere preferentially to the receptor element; and (d) separating the donor element and receptor element, leaving an image residing on the receptor element;
wherein the receptor element comprises a substrate having a textured receiving layer surface comprising a plurality of protrusions projecting above the plane of the surface of the receiving layer by an average distance no greater than about 8 $\mu$m, there being an average at least 1 protrusion area of A $\mu m^2$.

A donor element is also provided,wherein the donor element comprises a substrate on which is coated transfer material comprising:

a binder comprising a hydroxylic resin;

a fluorocarbon additive;

a cationic infrared absorbing dye;

a latent crosslinking agent having a nucleus of the following formula:

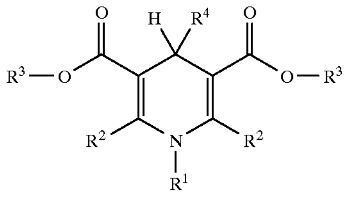

wherein $R^1$ represents H or an organic group;
each of $R^2$ and $R^3$ represents an organic group; and
$R^4$ represents an aryl group; and a dispersible material.

DETAILED DESCRIPTION OF PREFERRED EMBODIMENTS

The system of the present invention involves a half tone laser-induced thermal imaging system for the production of half tone color proofs. More specifically, the system of the present invention involves the mass transfer of a color half tone image from a donor element (also referred to herein as the "donor") to a receptor element (also referred to herein as the "receptor") under the influence of the energy supplied by a laser. The use of a laser is in contrast to systems that use thermal printheads to supply the energy needed for transfer of an image, which are typically referred to as "thermal transfer systems." The mass transfer system of the present invention is also in contrast to dye transfer systems that involve the formation of continuous tone (i.e., contone) images. The mass transfer system of the present invention provides a solution to the problem of the clean transfer of colorant, binder, and other additives in a laser-induced system.

The system of the present invention involves the mass transfer of a half tone image in the form of discrete dots of a film of binder, colorant, and additives from the donor to the receptor. The dots are formed from a molten or softened film, and have well-defined, generally continuous edges that are relatively sharp with respect to density or edge definition (i.e., not feathered). In other words, the dots are formed with relatively uniform thickness over their area. This is in contrast to discrete dots formed as a result of thermal or laser dye transfer of a molecular dye (which involves transfer of the colorant without binder, either by diffusion or sublimation) or as a result of laser ablation mass transfer of fragments of material (which involves at least partially decomposing and/or volatilizing the binder or other additives in or under the transfer material to generate propulsive forces to propel the colorant toward the receptor). Neither laser ablation mass transfer nor dye transfer produce well-defined dots with relatively uniform thickness. Such generally continuous and relatively sharp edges produced by the system of the present invention are important for producing controlled, reproducible dot gain (i.e., changes in half tone dot size), and therefore, controlled, reproducible colors. Also, the system of the present invention includes components, such as latent crosslinking agents and bleaching agents, that provide a more controllable dot size and more reproducible and accurate colors, as described in greater detail below.

Thus, the present invention provides a system in which excellent image quality is provided by melt transfer in which the colorant layer transfers essentially in the form of a coherent film, and does not apparently achieve a state of high fluidity during the transfer process. Indeed, this transfer mechanism, referred to herein as a laser-induced film transfer, is promoted by the inclusion in the transfer layer of compounds that effect at least a partial hardening of that layer during the transfer process. Although other systems involve crosslinking a colorant layer subsequent to transfer to the receptor to prevent back transfer during transfer of the next colorant layer, as in U.S. Pat. No. 5,395,729 (Reardon) and EP Publication Nos. 160,395 (ICI) and 160,396 (ICI), the ability to effect hardening as a direct result of laser transfer, and hence produce a durable transferred image that is not prone to back transfer is a major improvement.

According to the present invention, the image can be formed on a final receptor either through "direct" or "indirect" imaging. During direct imaging of the system, the image is transferred from a single colored layer of material coated on a donor to the final receptor. The colored donor is placed in intimate contact with the final receptor and imagewise exposed to a laser. In the areas in which the laser beam strikes the donor, the single colored layer is transferred from the donor to the receptor. When the donor is subsequently removed, the imaged areas remain on the receptor and the non-imaged areas remain on the donor. Multi-colored images are formed by repeating this process with different colored donors in register with the final receptor.

During indirect imaging of the system of the present invention, the image is transferred from a single colored layer of material coated on a donor to an intermediate receptor on which is coated a strippable layer of material. A reverse image is formed on the intermediate receptor by means of a laser-induced transfer of colored material from the donor to the intermediate receptor, which are in intimate contact, as described above for direct transfer. Multi-colored images are formed by repeating this process with different colored donors in register with the intermediate receptor. When all the desired colored images have been transferred to the intermediate receptor, then the multi-colored image, along with associated strippable layers, are transferred from the intermediate receptor to a final receptor.

Significantly, as a result of the combinations of the various components of the laser-induced thermal imaging system of the present invention, and interactions between certain of the components, the system of the present invention is capable of producing high resolution half tone color proofs. Preferably, the resolution of the transferred image resulting from the system of the present invention is at least about 300 dots per inch, more preferably, at least about 1000 dots per inch, most preferably, at least about 3000 dots per inch, and even higher resolution is possible if not limited by the equipment. Thus, the system of the present invention is capable of producing contract quality half tone color proofs.

Also, as a result of the combinations of the various components of the laser-induced thermal imaging system of the present invention, and interactions between certain of the components, the system of the present invention is capable of producing high quality images at relatively low laser fluences (i.e., the energy delivered per unit time), thereby resulting in enhanced sensitivity. Preferably, the sensitivity (i.e., the lowest laser fluence required for transfer) of the system of the present invention is no greater than about 0.5 Joule/$cm^2$, more preferably, no greater than about 0.3 Joule/$cm^2$, and most preferably, no greater than about 0.25 Joule/$cm^2$. This is significant because higher laser fluences (e.g., greater than 0.75 Joule/$cm^2$), can produce reduced image quality as a result of ablative transfer, even without a decomposable binder.

Furthermore, as a result of the combinations of the various components of the laser-induced thermal imaging system of the present invention, and interactions between certain of the components, the system of the present invention is capable of producing high quality images at relatively high throughput rates. For example, a four color proof can be made using the system of the present invention in about 20 minutes.

Donor Element

The donor element (i.e., donor) of the present invention typically includes a substrate on which is coated transfer material, which can be in one or more layers, preferably in one layer, containing a hydroxylic binder, a fluorocarbon additive, a bleachable infrared absorbing dye, a latent crosslinking agent (i.e., latent curing agent), and a dispersible material (e.g., pigment), all of which are described in detail below. Other components that are optional, although preferred, include a dispersant, and coating aids, such as a fluorocarbon surfactant.

Substrate

Suitable substrates for the donor include, for example, plastic sheets and films, such as, polyethylene terephthalate, fluorene polyester polymers, polyethylene, polypropylene, acrylics, polyvinyl chloride and copolymers thereof, and hydrolyzed and non-hydrolyzed cellulose acetate. The substrate needs to be sufficiently transparent to the imaging radiation emitted by the laser or laser diode to effect thermal transfer of the corresponding image to a receptor sheet. A preferred substrate for the donor is a polyethylene terephthalate sheet. Typically, the polyethylene terephthalate sheet is about 20 μm to about 200 μm thick. If necessary, the substrate may be surface-treated so as to modify its wettability and adhesion to subsequently applied coatings. Such surface treatments include corona discharge treatment, and the application of subbing layers or release layers.

The donor element may include a microstructured surface on the laser addressed surface (i.e., backsize) to reduce the formation of optical interference patterns, although significantly this has not been a problem with the system of the present invention. The microstructured surface may be composed of a plurality of randomly positioned discrete protuberances of varying heights and shapes. Microstructured surfaces may be prepared by the methods described in U.S. Pat. Nos. 4,340,276 (Maffitt), 4,190,321 (Dorer), and 4,252,843 (Dorer).

Binder

The binder in the transfer material comprises a crosslinkable binder which is a hydroxylic resin (i.e., a resin having a plurality of hydroxy groups). Preferably, 100% of the binder is a hydroxylic resin. Prior to laser address, the transfer material ideally should be in the form of a smooth, tack-free coating, with sufficient cohesive strength and durability to resist damage by abrasion, peeling, flaking, dusting, etc., in the course of normal handling and storage. If the hydroxy-functional resin is the sole or major component of the binder, then its physical and chemical properties should be compatible with the above requirements. Thus, film-forming polymers with glass transition temperatures higher than ambient temperature are preferred. The polymers should be capable of dissolving or dispersing the other components of the transfer material, and should themselves be soluble in the typical coating solvents such as lower alcohols, ketones, ethers, hydrocarbons, haloalkanes and the like.

The hydroxy groups may be alcoholic groups or phenolic groups (or both), but alcoholic groups are preferred. The requisite hydroxy groups may be incorporated in a polymeric resin by polymerization or copolymerization of hydroxy-functional monomers such as allyl alcohol and hydroxyalkyl acrylates or methacrylates, or by chemical conversion of preformed polymers, e.g., by hydrolysis of polymers and copolymers of vinyl esters such as vinyl acetate. Polymers with a high degree of hydroxy functionality, such as poly(vinyl alcohol), cellulose, etc., are in principle suitable for use in the invention, but in practice their solubility and other physico-chemical properties are less than ideal for most applications. Derivatives of such polymers, obtained by esterification, etherification, or acetalization of the bulk of the hydroxy groups, generally exhibit superior solubility and film-forming properties, and provided that at least a minor proportion of the hydroxy groups remain unreacted, they are suitable for use in the invention. Indeed, the preferred hydroxy-functional resin for use in the invention belongs to this class, and is the product formed by reacting poly(vinyl alcohol) with butyraldehyde. Commercial grades of this material typically leave at least 5% of the hydroxy groups unreacted (i.e., free) and combine solubility in common organic solvents with excellent film-forming and pigment-dispersing properties.

Preferably, the hydroxylic binder is a polyvinyl butyral binder available under the trade designation BUTVAR B-76 from Monsanto, St. Louis, Mo. This particular binder has a softening range of about 140° C. to about 200° C. Other hydroxylic binders from the BUTVAR series of polymers may be used in place of the BUTVAR B-76. These include, for example, other polyvinyl butyral binders available under the trade designations BUTVAR B-79 from Monsanto and MOWITAL B30T from Hoechst Celanese, Chatham, N.J. The various products typically vary with respect to the amount of free hydroxyl groups. For example BUTVAR B-76 polyvinyl butyral includes less than about 15-mole % free hydroxy groups, whereas MOWITAL B30T polyvinyl butyral includes about 30% free hydoxy groups. Although such polyvinyl butyral binders are not typically used in crosslinking reactions, in the system of the present invention it is believed that the BUTVAR B-76 polyvinyl butyral crosslinks with the latent crosslinking agent described below.

Alternatively, a blend of one or more noncrosslinkable resins with one or more crosslinkable hydroxy-functional resins may be used. The noncrosslinkable resin typically provides the requisite film-forming properties, which may enable the use of lower molecular weight polyols, but this is not preferred. Such resins should be compatible with the laser-address system of the present invention such that they do not interfere with the color formation. That is, they should be nonreactive when exposed to the conditions used during imaging of the laser-address system of the present invention. Suitable such resins include, for example, polyesters, polyamides, polycarbamates, polyolefins, polystyrenes, polyethers, polyvinyl ethers, polyvinyl esters, polyacrylates, polymethacrylates, and the like. Some examples of suitable noncrosslinkable resins that can be combined with the crosslinkable resin described above in the transfer material include, for example, polymethyl methacrylate resins, such as that available under the trade designation ELVACITE from DuPont, Wilmington, Del. Whether crosslinkable or noncrosslinkable, resins that decompose under laser address imaging conditions are less desirable, although not entirely unusable. For example, polymers and copolymers of vinyl chloride are less desirable because they can decompose to release chlorine, which leads to discoloration and problems with accurate color match.

The total binder is present in an amount of about 25 wt-% to about 75 wt-%, preferably in an amount of about 35 wt-% to about 65 wt-%, based on the dry coating weight of the transfer material. Preferably, the hydroxy-equivalent weight of the total binder is at least about 1000 grams/mole.

Fluorocarbon Additive

The transfer material also includes a fluorocarbon additive for enhancing transfer of a molten or softened film and production of half tone dots (i.e., pixels) having well-defined, generally continuous, and relatively sharp edges. Under the conditions currently used in preparing and imaging the system of the present invention, it is believed that the fluorocarbon additive serves to reduce the cohesive forces within the transfer material at the interface between the laser-exposed heated regions and the unexposed regions, and thereby promotes clean "shearing" of the layer in the direction perpendicular to its major surface. This provides improved integrity of the dots with sharper edges, as there is less tendency for "tearing" or other distortion as the transferred pixels separate from the rest of the donor layer. Thus, unlike dye transfer systems, in which just the colorant is transferred, and unlike ablation transfer systems, in which gases are typically formed that propel the colorant toward the receptor, the system of the present invention forms images by transfer of the binder, pigment, and other additives, in a molten or softened state as a result of a change in cohesive forces. The change in cohesive forces assists in limiting the domain of the transferred material, thus, providing more control of the dot size.

As stated in the background, an effect of the propulsive forces in an ablative system, however they are formed, is a tendency for the colorant to "scatter," producing less well-defined dots made of fragments. In contrast, the system of the present invention produces dots formed from and transferred as a molten or softened film of material (e.g., binder, pigment, and additives). It is believed that the fluorocarbon additive, along with the crosslinking agent (discussed in greater detail below), promotes controllable flow of the material from the transfer material in a molten or softened state. This mechanism is similar to what occurs in conventional thermally induced wax transfer systems; however, the molten or softened material of the transfer material in the system of the present invention does not uncontrollably wick across to the receptor and spread over the surface of the receptor. Rather, the system of the present invention involves a more controlled mechanism in which the material melts or softens and transfers. This controlled mechanism results in reduced dot gain and high resolution, relative to thermally induced wax transfer systems.

A wide variety of compounds may be used, as the fluorocarbon additive, provided they are substantially involatile under normal coating and drying conditions, and sufficiently miscible with the binder material(s). Thus, highly insoluble fluorocarbon resins, such as polytetrafluoroethylene and polyvinylidenefluoride, are unsuitable, as are gases and low boiling liquids, such as perfluoralkanes. With the above exceptions, both polymeric and lower molecular weight materials may be used, although the latter are preferred. Preferably the fluorocarbon additive is selected from compounds comprising a fluoroaliphatic group attached to a polar group or moiety and fluoropolymers having a molecular weight of at least about 750 and comprising a non-fluorinated polymeric backbone having a plurality of pendant fluoroaliphatic groups, which aliphatic groups comprise the higher of: (a) a minimum of three C—F bonds; or (b) in which 25% of the C—H bonds have been replaced by C—F bonds such that the fluorochemical comprises at least 15% by weight of fluorine.

Suitable fluorocarbon additives are disclosed in EP Publication No. 0 602,893 (3M Company) and the references cited therein. A preferred fluorocarbon additive is a sulfonamido compound $(C_8F_{17})SO_2NH(CH_2CH_3)$ (N-ethyl perfluorooctanesulfonamide), which includes 70% straight chains and 30% branched chains. The fluorocarbon additive is typically used in an amount of about 1 weight percent to about 10 weight percent, based on the dry coating weight of the transfer material. Preferably, the weight ratio of fluorocarbon to dispersible material (e.g., pigment) is at least about 1:10, and more preferably at least about 1:5.

Infrared Absorbing Dye

The infrared absorbing dye (also referred to as a "photothermal converting dye") used in the system of the present invention is a light-to-heat converter. It is a cationic dye. Cationic dyes produce transparent films when in combination with the binder resin and other components of the transfer material described herein. In contrast, neutral dyes, such as squarylium and croconium dyes, produce dispersion aggregates resulting in coatings with visible agglomerated pigments. Also, anionic dyes, such as cyanine dyes, are incompatible with the transfer material of the present invention, and result in flocculation of the pigment dispersion.

The infrared absorbing dye is preferably a bleachable dye, meaning that it is a dye capable of being bleached. Bleaching of the dye means that there is an effective dimunition of absorption bands that give rise to visible coloration of the infrared absorbing dye. Bleaching of the infrared absorbing dye may be achieved by destruction of its visible absorption bands, or by shifting them to wavelengths that do not give rise to visible coloration, for example.

Suitable cationic dyes for use in the transfer material of the present invention are selected from the group of tetraarylpolymethine (TAPM) dyes, amine cation radical dyes, and mixtures thereof. Preferably, the dyes are the tetraarylpolymethine (TAPM) dyes. Dyes of these classes are typically found to be stable when formulated with the other ingredients (i.e., to be compatible with the binder resin and other components of the transfer material), and to absorb in the correct wavelength ranges for use with the commonly available laser sources. Furthermore, dyes of these classes are believed to react with the latent crosslinking agent, described below, when photoexcited by laser radiation. This reaction not only contributes to bleaching of the infrared absorbing dye, but also leads to crosslinking of the binder, as described in greater detail below. Yet another useful property shown by many of these dyes is the ability to undergo thermal bleaching by nucleophilic compounds and reducing agents that may be incorporated in the receptor layer, as is also described in greater detail below.

TAPM dyes comprise a polymethine chain having an odd number of carbon atoms (5 or more), each terminal carbon atom of the chain being linked to two aryl substituents. These generally absorb in the 700 nm to 900 nm region, making them suitable for diode laser address. There are several references in the literature to their use as absorbers in laser address thermal transfer media, e.g., JP Publication Nos. 63-319191 (Showa Denko) and 63-319192 (Shonia Denko), U.S. Pat. No. 4,950,639 (DeBoer), and EP Publication Nos. 0 602 893 (3M Company) and 0 675 003 (3M Company). When these dyes are cotransferred with pigment, a blue cast is given to the transferred image because the TAPM dyes generally have absorption peaks which tail into the red region of the spectrum. However, this problem is solved by means of the bleaching processes, and described in greater detail below.

Preferred dyes of the TAPM class have a nucleus of formula (I):

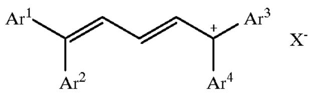

wherein: $Ar^1$ to $Ar^4$ are aryl groups that are the same or different and at least one (and more preferably at least two) of the aryl groups represented by $Ar^1$ to $Ar^4$ has a tertiary amino substituent (preferably in the 4-position), and X is an anion. Preferably no more than three (and more preferably no more than two) of said aryl groups bear a tertiary amino group. The aryl groups bearing said tertiary amino groups are preferably attached to different ends of the polymethine chain (i.e., $Ar^1$ or $Ar^2$ and $Ar^3$ or $Ar^4$ have tertiary amino groups).

Examples of tertiary amino groups include dialkylamino groups (such as dimethylamino, diethylamino, etc.), diarylamino groups (such as diphenylamino), alkylarylamino groups (such as N-methylanilino), and heterocyclic groups such as pyrrolidino, morpholino, or piperidino. The tertiary amino group may form part of a fused ring system, e.g., one or more of $Ar^1$ to $Ar^4$ may represent a julolidine group.

The aryl groups represented by $Ar^1$ to $Ar^4$ may comprise phenyl, naphthyl, or other fused ring systems, but phenyl rings are preferred. In addition to the tertiary amino groups discussed previously, substituents which may be present on the rings include alkyl groups (preferably of up to 10 carbon atoms), halogen atoms (such as Cl , Br, etc.), hydroxy groups, thioether groups and alkoxy groups. Substituents which donate electron density to the conjugated system, such as alkoxy groups, are particularly preferred. Substituents, especially alkyl groups of up to 10 carbon atoms or aryl groups of up to 10 ring atoms, may also be present on the polymethine chain.

Preferably the anion X is derived from a strong acid (e.g. HX should have a pKa of less than 3, preferably less than 1). Suitable identities for X include $ClO_4$, $BF_4$, $CF_3SO_3$, $PF_6$, $AsF_6$, $SbF_6$ and perfluoroethylcyclohexylsulphonate.

Particularly preferred cationic polymethine dyes that can be bleached by reacting with various bleaching agents have the following structures:

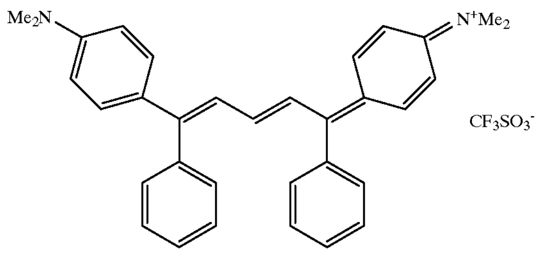

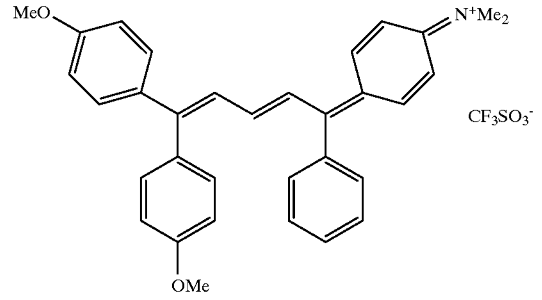

The TAPM dyes of formula (I) may be synthesized by known methods, e.g., by conversion of the appropriate benzophenones to the corresponding 1,1-diarylethylenes (by the Wittig reaction, for example), followed by reaction with a trialkyl orthoester in the presence of strong acid HX.

Suitable cationic infrared dyes, although less preferred than the TAPM dyes as the TAPM dyes are more readily bleached, include the class of amine cation radical dyes (also known as immonium dyes) disclosed, for example, in International Publication No. WO 90/12342, JP Publication No. 51-88016 (Canon) and (in greater detail) in European Patent No. Application No. 96/302794.1 (3M Company). Included in this class are the diamine dication radical dyes (in which the chromophore bears a double positive charge), exemplified by materials such as CYASORB IR165, which is commercially available from Glendale Protective Technologies Inc., Lakeland, Fla. Such dyes have a nucleus of the following general formula (II):

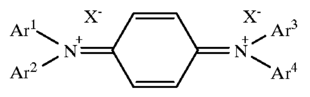

in which $Ar^1$–$Ar^4$ and X are as defined above. Dyes of this class typically absorb over a broad range of wavelengths in the near infrared, making them suitable for address by YAG lasers as well as diode lasers. Although these dyes show peak absorptions at relatively long wavelengths (approximately 1050 nm, suitable for YAG laser address), the absorption band is broad and tails into the red region, which gives a blue cast to the transferred image. As discussed above, this problem is solved by means of a bleaching process described in greater detail below.

The bleachable infrared absorbing dye is preferably present in a sufficient quantity to provide a transmission optical density of at least about 0.5, more preferably, at least about 0.75, and most preferably, at least about 1.0, at the exposing wavelength. Typically, this is accomplished with about 3 wt-% to about 20 wt-% infrared dye, based on the dry coating weight of the transfer material.

Latent Crosslinking Agent

The latent crosslinking agent (i.e., latent curing agent) is a compound having a nucleus of formula (III):

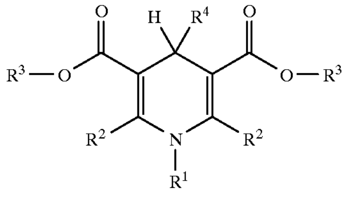

This latent crosslinking agent is preferably used in the transfer material in an amount of up to about 30 wt-%, based on the dry coating weight of the transfer material, although it can be used in the receptor element in addition to being used in the donor element. As used herein, a latent crosslinking agent is one that is typically only reactive in the system under conditions of laser address.

The crosslinking agent is believed to be important for providing cohesion within the transferred pixel. This complements the action of the fluorocarbon additive, and results in transfer of the pixel as a coherent film, which enables dots of controlled size with sharp edges to be formed, leading to high quality images with reproducible colors. It is also believed to be important for preventing retransfer of pigment back to the donor, as well as back transfer of pigment to the donor in a subsequent imaging step.

It is believed that during laser imaging, this crosslinking agent reacts with the photoexcited infrared absorbing dye to form the corresponding pyridinium compound, which is activated to crosslink with hydroxylic binders such as BUTVAR B-76. Thus, crosslinking occurs during laser imaging. Although it is not intended that the invention should be limited to any particular curing mechanism, it is believed that the compounds of formula (III) are oxidized in the course of laser irradiation of the transfer material, forming the corresponding pyridinium salts which have a positive charge associated with the pyridine ring. The presence of this positive charge activates the ester side chains towards transesterification reactions with the hydroxy-functional resin, leading to crosslinking and hardening of the resin. This mechanism may be summarized as follows:

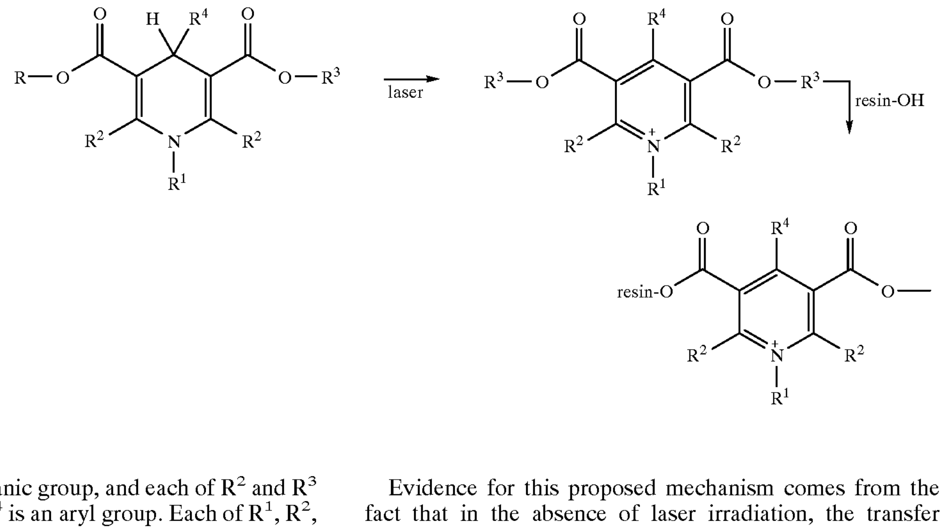

wherein: $R^1$ is H or an organic group, and each of $R^2$ and $R^3$ is an organic group, and $R^4$ is an aryl group. Each of $R^1$, $R^2$, and $R^3$ can be a polymeric group. That is, these can be a cite by which compounds having the nucleus of formula (III) form polymers, as long as the carbonyl groups are available for interaction with the hydroxylic binder. Preferably, $R^1$ is selected from the group of H, an alkyl group, a cycloalkyl group, and an aryl group (more preferably, $R^1$ is selected from the group of an alkyl group, a cycloalkyl group, and an aryl group); each $R^2$ and $R^3$ is independently an alkyl group or an aryl group; and $R^4$ is an aryl group.

Evidence for this proposed mechanism comes from the fact that in the absence of laser irradiation, the transfer media show little or no tendency for thermal curing, and that the compounds of formula (III) in which $R^1$ is H (which may be oxidized to neutral pyridine derivatives) appear to be less active as curing agents than the corresponding N-alkyl and N-aryl derivatives.

The crosslinking effect during laser imaging results in a high quality transferred dot formed of a film with well-defined, generally continuous, and relatively sharp edges. It also prevents retransfer of colorant back to the donor, as well as back transfer of colorant to the donor in a subsequent imaging step. This greatly simplifies the imaging process, as well as yielding more controllable film transfer. These effects can be enhanced by subsequent heating to promote higher crosslink density.

In formula (III), $R^1$ preferably is any group compatible with formation of a stable pyridinium cation, which includes essentially any alkyl, cycloalkyl or aryl group, but for reasons of cost and convenience, lower alkyl groups having 1 to 5 carbon atoms (such as methyl, ethyl, propyl, etc.) or simple aryl groups (such as phenyl, tolyl, etc.) are preferred. Similarly, $R^2$ may represent essentially any alkyl or aryl group, but lower alkyl groups of 1 to 5 carbon atoms (such as methyl, ethyl, etc.) are preferred for reasons of cost and ease of synthesis. $R^3$ may also represent any alkyl or aryl group, but is preferably selected so that the corresponding alcohol or phenol, $R^3$—OH, is a good leaving group, as this promotes the transesterification reaction believed to be central to the curing mechanism. Thus, aryl groups comprising one or more electron-attracting substituents such as nitro, cyano, or fluorinated substituents, or alkyl groups of up to 10 carbon atoms are preferred. Most preferably, each $R^3$ represents lower alkyl group such as methyl, ethyl, propyl etc, such that $R^3$—OH is volatile at temperatures of about 100° C. and above. $R^4$ may represent any aryl group such as phenyl, naphthyl, etc., including substituted derivatives thereof, but is most conveniently phenyl.

Analogous compounds in which $R^4$ represents H or an alkyl group are not suitable for use in the donor elements of the invention, because such compounds react at ambient or moderately elevated temperatures with many of the infrared dyes suitable for use in the invention, and hence the relevant compositions have a limited shelf life. In contrast, the compounds in which $R^4$ is an aryl group are stable towards the relevant dyes in their ground state, and the relevant compositions have a good shelf life. The analogous compounds in which $R^4$ represents H or an alkyl group may, however, be incorporated in the receptor, where their thermal bleaching action towards the infrared absorbing dye is beneficial.

Significantly, because the latent crosslinking agent can also act as a bleaching agent, it helps control the heat generated during imaging. That is, the latent crosslinking agent helps bleach out the infrared absorbing dye, thereby quenching the dye's absorption and moderating any tendency for runaway temperature rises, which could possibly cause ablation of the coating.

Such dihydropyridines can be prepared by known methods, e.g., by an adaptation of the Hantsch pyridine synthesis. A particularly preferred latent crosslinking agent used in the transfer material is an N-phenyldihydropyridine-derived compound. It has the following structure:

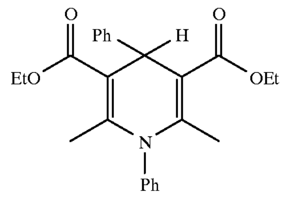

Dispersible Material

The dispersible material (also referred to as the "dispersed" material when dispersed within the transfer material) is a particulate material that is of sufficiently small particle size that it can be dispersed within the transfer material, with or without the aid of a dispersant. Suitable dispersible materials for use in the transfer material typically include colorants such as pigments and crystalline nonsublimable dyes. The pigment(s) or nonsublimable dye(s) in the transfer material are those typically used in the printing industry. Thus, the dispersible materials may be of a variety of hues. Alternatively, they may not necessarily add color but simply enhance the color (i.e., color enhancing additives), or they may be clear or colorless and provide a texturized image (i.e., texturizing material). Thus, the transfer material used in forming a color proof may also be colorless when it is desirable to stimulate a spot varnish, for example. Such texturizing materials can be colorless when their index of refraction matches that of the binder.

Essentially any dye or pigment or mixture of dyes and/or pigments of the desired hue may be used as a dispersible material in the transfer material. They are generally insoluble in the transfer material coating composition and are nonsublimable under imaging conditions at atmospheric pressures. They should also be substantially unreactive with the bleaching agent under both ambient conditions and during the imaging process.

Dispersible materials that enhance color (i.e., color enhancing additives) include, for example, fluorescent, pearlescent, iridescent, and metallic materials. Materials such as silica, polymeric beads, reflective and non-reflective glass beads, or mica may also be used as the dispersible material to provide a textured image. Such materials are typically colorless, although they may be white or have a color that does not detract from the color of the pigment, for example, and can be referred to as texturizing materials. The color enhancing additives or texturing materials may be used either alone or in combination with pigments or crystalline nonsublimable dyes to produce proofs with the desired visual effects.

Pigments and crystalline nonsublimable polymeric dyes are preferred because they have a lower tendency for migration between the layers. Pigments are more preferred due to the wide variety of colors available, their lower cost, and their greater correlation to printing inks. Pigments in the form of dispersions of solid particles are particularly preferred. Solid-particle pigments typically have a much greater resistance to bleaching or fading on prolonged exposure to sunlight, heat, humidity, etc., in comparison to soluble dyes, and hence can be used to form durable images. The use of pigment dispersions in color proofing materials is well known in the art, and any of the pigments previously used for that purpose may be used in the present invention. Pigments or blends of pigments matching the yellow, magenta, cyan, and black references provided by the International Prepress Proofing Association (known as the SWOP color references) are particularly preferred, although the invention is by no means limited to these colors. Pigments of essentially any color may be used, including those conferring special effects such as opalescence, fluorescence, UV absorption, IR absorption, ferromagnetism, etc.

Transfer media intended for color imaging preferably contain sufficient dispersible material to preferably provide a reflection optical density of at least 0.5, preferably preferably, at least 1.0, at the relevant viewing wavelength (s). Thus, the pigment(s) or nonsublimable dye(s) are preferably present in the transfer material in an amount of about 10 weight percent (wt-%) to about 40 weight percent, based on the dry weight of the transfer material.

Pigments are generally introduced into the transfer material composition in the form of a millbase comprising the pigment dispersed with a binder and suspended in a solvent or mixture of solvents. The dispersion process may be accomplished by a variety of methods well known in the art, such as two-roll milling, three-roll milling, sand milling, ball milling, etc. Many different pigments are available and are well known in the art. The pigment type and color are chosen such that the coated color proofing element is matched to a preset color target or specification set by the industry.

The type and amount of binder used in the dispersion are dependent upon the pigment type, surface treatment on the pigment, dispersing solvent, and milling process. The binder is typically the same hydroxy-functional polymeric resin described above. A preferred resin is a polyvinyl acetal such as a polyvinyl butyral available under the trade designation BUTVAR B-76 from Monsanto, St. Louis, Mo.

Optional Additives

Coating aids, dispersing agents, optical brighteners, UV absorbers, fillers, etc., can also be incorporated into the pigment mill base, or in the overall transfer material composition. Dispersing agents (i.e., dispersants) may be necessary to achieve optimum dispersion quality. Some examples of dispersing agents include, for example, polyester/polyamine copolymers, alkylarylpolyether alcohols, acrylic resins, and wetting agents. The preferred dispersant in the transfer material is a block copolymer with pigment affined groups, which is available under the trade designation DISPERBYK 161 from Byk-Chemie USA, Wallingford, Conn. The dispersing agent is preferably used in the dispersion in an amount of about 1 weight percent to about 6 weight percent, based on the dry coating weight of the transfer material.

Surfactants may be used to improve solution stability. A wide variety of surfactants can be used. One preferred surfactant is a fluorocarbon surfactant is used in the transfer material to improve coating quality. Suitable fluorocarbon surfactants include fluorinated polymers, such as the fluorinated polymers described in U.S. Pat. No. 5,380,644 (Yonkoski et al.). It is used in an amount of at least about 0.05 weight percent, preferably at least about 0.05 weight percent and no greater than about 5 weight percent, and typically in an amount of no greater than about 1–2 weight percent.

Preparation of the Donor Element

The transfer material may be coated as a single layer, or as two or more contiguous layers. For example, the infrared dye may be coated as an underlayer with the remaining ingredients coated on top, but a transfer medium comprising all the necessary components in a single layer is preferred.

The relative proportions of the components of the transfer material may vary widely, depending on the particular choice of ingredients and the type of imaging required. For example, transfer materials designed for color proofing purposes typically have a high pigment to binder ratio, and may not require a high degree of curing in the transferred image.

Transfer material compositions for use in the invention are readily prepared by dissolving or dispersing the various components in a suitable solvent, typically an organic solvent, and coating the mixture on a substrate. The solvent is typically present in an amount of at least about 80 weight percent. The organic solvent is typically an alcohol, a ketone, an ether, a hydrocarbon, a haloalkane, or mixtures thereof. Suitable solvents include, for example, methanol, ethanol, propanol, 1-methoxy ethanol, 1-methoxy-2-propanol, methyl ethyl ketone, diethylene glycol monobutyl ether (butyl CARBITOL), and the like. Tyically, a mixture of solvents is used, which assists in controlling the drying rate and avoiding forming cloudy films. An example of such a mixture is methyl ethyl ketone, ethanol, and 1-methoxy propanol.

Pigmented transfer material compositions are most conveniently prepared by predispersing the pigment in the hydroxy-functional resin in roughly equal proportions by weight, in accordance with standard procedures used in the color proofing industry, thereby providing pigment "chips." Milling the chips with solvent provides a millbase, to which further resin, solvents, etc., are added as required to give the final coating formulation. Any of the standard coating methods may be employed, such as roller coating, knife coating, gravure coating, bar coating, etc., followed by drying at moderately elevated temperatures.

The relative proportions of the components of the transfer material may vary widely, depending on the particular choice of ingredients and the type of imaging required. Preferred pigmented media for use in the invention have the following approximate composition (in which all percentages are by weight):

| | |
|---|---|
| hydroxy-functional film-forming resin (e.g., BUTVAR B76) | 35 to 65% |
| latent curing agent | up to 30% |
| infrared dye | 3 to 20% |
| pigment | 10 to 40% |
| pigment dispersant (e.g., DISPBRBYK 161) | 1 to 6% |
| fluorochemical additive (e.g., a perfluoroalkylsulphonamide) | 1 to 10% |

Thin coatings (e.g., of less than about 3 $\mu$m dry thickness) of the transfer material composition may be transferred to a variety of receptor sheets by laser irradiation. Transfer occurs with high sensitivity and resolution, and heating the transferred image for relatively short periods (e.g., one minute or more) at temperatures in excess of about 120° C. causes curing and hardening, and hence an image of enhanced durability. Although primarily designed for transfer to paper or similar receptors for color proofing purposes, transfer material compositions described herein may alternatively be transferred to a wide variety of substrates.

Receptor

The receptor is chosen based on the particular application. Receptors may be transparent or opaque. Suitable receptors include coated paper, metals (i.e., steel and aluminum); films or plates composed of various film-forming synthetic or high polymers including addition polymers (e.g., poly(vinylidene chloride), poly(vinyl chloride), poly(vinyl acetate), polystyrene, polyisobutylene polymers and copolymers), and linear condensation polymers (e.g., poly(ethylene terephthalate), poly(hexamethylene adipate), and poly (hexamethylene adipamide/adipate)). The receptor may be transparent or opaque. Nontransparent receptor sheets may be diffusely reflecting or specularly reflecting.

For the system of the present invention the receptor preferably comprises a texturized surface. That is, the receptor preferably includes a support bearing a plurality of protrusions. The protrusions can be obtained in a variety of ways. For example, particulate material may be used to form the protrusions. Alternatively, the support may be microreplicated, thereby forming the protrusions. This is discussed in greater detail below.

For color imaging, the receptor is preferably paper (plain or coated) or a plastic film coated with a thermoplastic receiving layer. The receiving layer is typically several micrometers thick, and may comprise a thermoplastic resin capable of providing a tack-free surface at ambient temperatures, and which is compatible with the transferred material. When a receiving layer is present, it may advantageously contain a bleaching agent for the infrared dye, as taught in EP Publication No. 0 675 003 (3M Company). Preferred bleaching agents for use in the system of the present invention are discussed below.

Texturizing Material (e.g., Particulate Material)

The receptor may be textured with particulate material or otherwise engineered so as to present a surface having a controlled degree of roughness. That is, the receptor of the present invention includes a support bearing a plurality of protrusions that project above the plane of the outer surface of the receptor. The protrusions may be created by incorporating polymer beads, silica particles, etc., in a binder to form a receiving layer, as disclosed, for example, in U.S. Pat. No. 4,876,235. Microreplication may also be used to create the protrusions, as disclosed in EP Publication No. 0 382 420.

When one (or both) of the donor and receptor sheets presents a oughened surface, vacuum draw-down of the one to the other is facilitated. Although the use of particulate material in color proof systems is known, as disclosed in U.S. Pat. No. 4,885,225 (Heller), for example, it has been discovered that the protrusions on the receptor significantly enhance the film transfer mechanism of the process of the present invention and thereby the image quality. Without such protrusions in (or on) the receptor surface, there can be a tendency for dust artefacts and mottle to result in small areas (approximately 1 mm) of no image transfer.

The protrusions in the receptor regulate precisely the relationship between the donor and the receptor. That is, the protrusions are believed to provide channels for air that would otherwise be trapped between the donor and receptor to escape so there is uniform contact between the donor and the receptor over the entire area, which is otherwise impossible to achieve for large images. More importantly, the protrusions are believed to prevent entrapment of air in the transferred imaged areas. As the molten or softened film transfers to the receptor in a given area the air can escape through the channels formed by the protrusions.

The protrusions provide a generally uniform gap between the donor and the receptor which is important for effective film transfer. The gap is not so large that ablative transfer occurs during imaging upon laser address. Preferably, the protrusions are formed from inert particulate material, such as polymeric beads.

The optimum size and concentration of beads or other particles was found to depend on the dimensions of the footprint of exposing laser, i.e., the diameter of the illuminated spot at the plane of the colorant layer, which determines the minimum size of dot or pixel which can be transferred from donor to receptor. This is typically in the range of about 5 μm to about 50 μm, but may be different for different designs of imaging engine. For example, the Presstek PEARLSETTER imager has a pixel size of about 30 μm diameter, while the Creo TRENDSETTER device has a pixel size of about 8 μm. The concentration of beads or other inert particles in the receptor layer should be sufficient to provide on average at least 1 point of contact per pixel between the donor and receptor layers, preferably at least 2 points of contact. Thus, loadings on the order of at least about $5\times10^2$, and preferably up to about $10^5$ particles per $mm^2$ are typically found to be useful.

The beads or other particles may be of essentially uniform size (i.e., a monodisperse population), or may vary in size. Dispersions of inorganic particles such as silica generally have a range of particle sizes, whereas monodisperse suspensions of polymer beads are readily available. Whichever type of population is used, the particles should not project above the plane of the surface of the receptor by more than about 8 μm on average, but should preferably project above said plane by at least about 1 μm, and more preferably at least about 3 μm. The composition of the polymeric beads is generally chosen such that substantially all of the visible wavelengths (400 nm to 700 nm) are transmitted through the material to provide optical transparency. Nonlimiting examples of polymeric beads that have excellent optical transparency include polymethylmethacrylate and polystearyl methacrylate beads, described in U.S. Pat. No. 2,701,245; and beads comprising diol dimethacrylate homopolymers or copolymers of these diol dimethacrylates with long chain fatty alcohol esters of methacrylic acid and/or ethylenically unsaturated comonomers, such as stearyl methacrylate/hexanediol diacrylate crosslinked beads, as described in U.S. Pat. Nos. 5,238,736 and 5,310,595.

The shape, surface characteristics, concentration, size, and size distribution of the polymeric beads are selected to optimize performance of the transfer process. The smoothness of the bead surface and shape of the bead may be chosen such that the amount of reflected visible wavelenghts (400 nm to 700 nm) of light is kept to a minimum. This may or may not be an issue depending upon the actual substrate used. For example, if the color proof is formed on a transparent substrate, the haze introduced by the presence of the beads may be effected by the color. The shape of the beads is preferably spherical, oblong, ovoid, or elliptical. In some constructions, it is advantageous to add two distinct sets of beads with different average sizes. This allows the flexibility to balance haze with slip or separation characteristics.

The optimum particle size depends on a number of factors, including the thickness of the receiving layer, the thickness of the transfer material (e.g., colorant layer) to be transferred, and the number of layers to be transferred to a given receptor. In the case of transfer of two or more layers to a single receptor, the projections provided by the particles must be great enough not to be obscured by the first layer(s) transferred thereto. If the average projection is significantly greater than about 8 μm, however, transfer of the transfer material as a coherent film becomes generally impossible, and the quality of the transferred image deteriorates markedly.

In the case of polydisperse populations of particles, such as silica particles, excellent results have been obtained when the largest of said particles project above the plane of the receptor layer by about 4 μm and provide on average at least 1 point of contact per pixel between the donor and receptor layers, with at least 2 (preferably at least 4) smaller particles also present per pixel. Good results have also been obtained using essentially monodisperse populations of polymer beads projecting about 4 μm above the plane of the receptor layer and providing on average at least 1 point of contact per pixel between the donor and receptor layers.

Bleaching Agent

A problem common to many imaging systems is the fact that, unless the infrared absorber is completely colorless, the final image is contaminated and not a true color reproduction, and hence unacceptable for high quality proofing purposes. For example, if the infrared absorbing dye is transferred to a receptor during imaging, it can visibly interfere with the color produced because it absorbs slightly in the visible region of the spectrum. Attempts have been made to minimize problems by placing the infrared absorber in a layer separate from the colorant, which may affect the sensitivity. Also, attempts have been made to find infrared absorbers with minimal visible absorption, as in, for example, EP Publication No. 0 157 568 (ICI). In practice, however, there is nearly always some residual absorption, which has limited the usefulness of the technology.

In the system of the present invention, the crosslinking agent discussed above also acts as a bleaching agent and contributes to the removal of this unwanted visible absorbance, so that a more accurate and predictable color may be achieved. However, the system of the present invention can additionally employ a separate thermal bleaching agent that is different from the crosslinking agent (e.g., a nucleophile such as an amine).

Suitable thermal bleaching agents (also referred to as "bleaching agents") do not require exposure to light to become active, but will bleach the relevant infrared dyes at ambient or elevated temperatures. The term "bleaching" means a substantial reduction in absorptions giving rise to color visible to the human eye, regardless of how this is achieved. For example, there may be an overall reduction in the intensity of the absorption, or it may be shifted to noninterfering wavelengths, or there may be a change in shape of the absorption band, such as, a narrowing, sufficient to render the infrared absorber colorless.

Suitable thermal bleaching agents include nucleophiles, such as an amine or a salt that decomposes thermally to release an amine, or a reducing agent, as described in EP Publication No. 0 675 003 (3M Company). A preferred class of bleaching agents are amines such as guanidine or salts thereof, wherein the guanidine bleaching agents have the following general formula (IV):

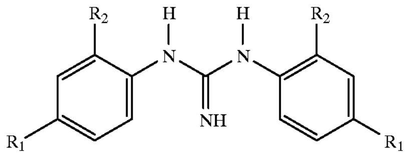

wherein each $R^1$ and $R^2$ is independently H or an organic group, preferably, H or an alkyl group (preferably, a $C_1$–$C_4$ alkyl group). Such diphenyl guanidines are commercially available (as from Aldrich Chemical Company, Milwaukee, Wis., or can be synthesized by reaction of cyanogen bromide with the appropriate aniline derivatives.

Guanidines have good stability, solubility, and compatibility with the binders disclosed herein. They are solids as opposed to liquids, and are rapid acting. Solids are advantageous because they are involatile at room temperature. They are relatively small molecules which diffuse very effectively into the transferred material when heated. Significantly, they do not discolor during storage, do not precipitate out of water-based systems (e.g., latex systems) prior to coating onto a substrate, and do not crystallize out of the coating.

Another class of bleaching agent, capable of bleaching the infrared absorbing dyes, comprises the 1,4-dihydropyridines of formula (III) described above, where $R^4$ is H or an alkyl group, preferably of up to 5 carbon atoms. Such compounds bleach TAPM dyes of formula (I) in which no more than three of the aryl groups represented by $Ar^1$–$Ar^4$ bear a tertiary amino substituent. The bleaching is believed to occur via a redox reaction. This class of bleaching agents is only partially effective in bleaching amine cation radical dyes.

Thermal bleaching agents of this type include the following:

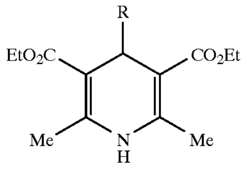

(wherein R is H or a $C_1$–$C_4$ alkyl group)

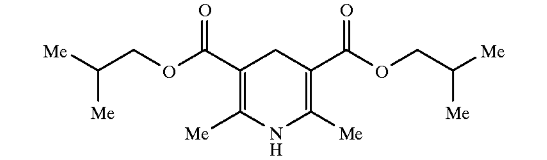

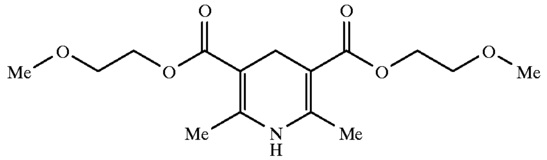

Whatever type of thermal bleaching agent is used, it is typically, and preferably, present prior to imaging in a receiving layer on the surface of the receptor element, although it is equally possible to deposit the thermal bleaching agent on the transferred image by appropriate means in an additional step subsequent to transfer of an image and separation of the donor and the receptor. Although the latter alternative requires an extra step, it has the advantage that no particular constraints are placed on the nature of the receptor, so that a variety of materials may be used for this purpose, including plain paper and conventional proofing bases. The preferred alternative, in which the bleaching agent is in a receiving layer on the receptor, streamlines the imaging process, but requires the use of a specially prepared receptor. In a further embodiment, the image residing on the receptor element after separating the donor and the receptor may be further transferred to a second receptor which comprises a layer containing a bleaching agent.

Quantities of about 10 mole percent based on the compound of formula IV are effective. Generally, loadings of about 2 weight percent to about 25 weight percent of the bleaching agent in the receptor layer are suitable, normally about 5 weight percent to about 20 weight percent.

Binder

The receptor to which the image is transferred, whether it be an intermediate receptor in an indirect transfer or a final receptor in a direct transfer, typically includes a substrate on which is coated a binder, and typically a bleaching agent, and optional additives such as particulate material, surfactants, and antioxidants, to form a receiving layer. The final receptor used in an indirect transfer process can be any receptor that will accept the image and strippable adhesive. This includes plain paper, coated paper, glass, polymeric substrates, and a wide variety of other substrates.

Preferably, the intermediate receptor consists of a polyethylene terephthalate sheet (75–150 micrometers thick) on which is coated a strippable layer consisting of an acrylic or a vinyl acetate adhesive. On this is coated a dispersion of a thermoplastic binder, a bleaching agent, and particulate material to form a receiving layer. The dispersion is typically coated out of water or an organic solvent. Suitable organic solvents include those listed above to coat the transfer material onto a substrate for preparation of the donor element, as well as others such as toluene, for example.

One preferred binder for use in the receiving layer is a polyvinyl pyrrolidone/vinyl acetate copolymer binder available under the trade designation E-735 from GAF, Manchester, UK. Another preferred binder is a styrene-butadiene copolymer available under the trade designation PLIOLITE S5C from Goodyear, Akron, Ohio. Yet another preferred binder is a phenoxy resin available under the trade designation PAPHEN PKHM-301 from Phenoxy Associates. This latter binder is particularly compatible with guanidines, thereby allowing for higher loading of the guanidines. Other additives may also be present, such as surfactants and antioxidants.

A suitable receptor layer comprises PLIOLITE S5A containing diphenylguanidine as bleach agent (10 wt % of total solids) and beads of poly(stearyl methacrylate) (8 μm diameter) (about 5 wt % of total solids), coated at about 5.9 $g/m^2$.

A particularly preferred receptor layer is obtained by coating the following formulation from methylethyl ketone (18 wt %) to provide a dry coating weight of 400 $mg/ft^2$ (4.3 $g/m^2$):

| | |
|---|---|
| PLIOLITE S5A | 87 wt % |
| Poly(stearyl methacrylate) beads (8 μm diameter) | 1 wt % |
| Diphenylguanidine | 12 wt % |

As an alternative to the use of beads or particles the receptor surface may be physically textured to provide the required protrusions. Metal surfaces, such as aluminum, may be textured by graining and anodizing. Other textured surfaces may be obtained by microreplication techniques, such as those disclosed in BP-A-382420.

The extent of the protrusions on the receptor surface, whether formed by bead, particles, or texturing, may be measured, for example, by interferometry or by examination of the surface using an optical or electron microscope.

An example of a final receptor for direct imaging is the MATCHPRINT Low Gain Commercial Base manufactured by Schoeller Technical Paper Sales, Inc. of Pulaski, N.Y. This receptor is a heat stable, waterproof material that includes a paper sheet sandwiched between two polyethylene layers.

Imaging Conditions

The procedure for imagewise transfer of material from donor to receptor involves assembling the two elements in intimate face-to-face contact, e.g., by vacuum hold down or alternatively by means of the cylindrical lens apparatus described in U.S. Pat. No. 5,475,418 and scanned by a suitable laser. The assembly may be imaged by any of the commonly used lasers, depending on the absorber used, but address by near infrared emitting lasers such as diode lasers and YAG lasers, is preferred. The assembly may be imaged by any of the commonly used lasers, depending on the absorber used, but address by near infrared and infrared emitting lasers such as diode lasers and YAG lasers, is preferred.

Any of the known scanning devices may be used, e.g., flat-bed scanners, external drum scanners, or internal drum scanners. In these devices, the assembly to be imaged is secured to the drum or bed, e.g., by vacuum hold-down, and the laser beam is focused to a spot, e.g., of about 20 micrometers diameter, on the IR-absorbing layer of the donor-receptor assembly. This spot is scanned over the entire area to be imaged while the laser output is modulated in accordance with electronically stored image information. Two or more lasers may scan different areas of the donor receptor assembly simultaneously, and if necessary, the output of two or more lasers may be combined optically into a single spot of higher intensity. Laser address is normally from the donor side, but may be from the receptor side if the receptor is transparent to the laser radiation.

Peeling apart the donor and receptor reveals a monochrome image on the receptor. The process may be repeated one or more times using donor sheets of different colors to build a multicolor image on a common receptor. Because of the interaction of the infrared absorbing dye and the bleaching agent during laser address, the final image can be free from contamination by the infrared absorbing dye. Typically, in the embodiments in which a bleaching agent is present in the receiving layer, subsequent heat treatment of the image may be required to activate or accelerate the bleach chemistry.

After peeling the donor sheet from the receptor, the image residing on the receptor can be cured by subjecting it to heat treatment, preferably at temperatures in excess of about 120° C. This may be carried out by a variety of means, such as storage in an oven, hot air treatment, contact with a heated platen or passage through a heated roller device. In the case of multicolour imaging, where two or more monochrome images are transferred to a common receptor, it is more convenient to delay the curing step until all the separate colorant transfer steps have been completed, then provide a single heat treatment for the composite image. However, if the individual transferred images are particularly soft or easily damaged in their uncured state, then it may be necessary to cure and harden each monochrome image prior to transfer of the next, but in preferred embodiments of the invention, this is not necessary.

In certain embodiments, the bleaching agent is present initially in neither the donor nor the receptor, and an additional step is required to bring it into contact with the contaminated image. While this technique requires an extra step, it does allow the use of an uncoated receptor, such as plain paper. Any suitable means may be employed to apply the bleaching agent to the transferred image, but "wet" methods such as dipping, spraying, etc., are not preferred. A suitable dry method is thermal lamination and subsequent peeling of a separate donor sheet containing the thermal bleaching agent. A bleaching agent donor sheet suitable for this purpose typically comprises a substrate (such as polyester film) bearing a layer of a thermoplastic resin (such as BUTVAR B-76, vinyl resins, acrylic resins etc.) containing the bleaching agent in an amount corresponding to about 5–25 weight percent of the total solids, preferably about 10–20 weight percent. Thus the construction of a bleaching agent donor sheet in accordance with the invention is very similar to that of a receptor element in accordance with the invention, and indeed a single element might well be capable of fulfilling either purpose. In some situations, the receptor to which a colorant image is initially transferred is not the final substrate on which the image is viewed. For example, U.S. Pat. No. 5,126,760 discloses thermal transfer of a multicolor image to a first receptor, with subsequent transfer of the composite image to a second receptor for viewing purposes. If this technique is employed in the practice of the present invention, curing and hardening of the image may conveniently be accomplished in the course of the transfer to the second receptor. In this embodiment of the invention, the second receptor may be a flexible sheet-form material such as paper, card, plastic film, etc. Alternatively, it may be convenient to provide the thermal bleaching agent in the second receptor, and/or to utilise the heat applied in the process of transferring the image to the second receptor to activate the bleaching reaction.

Advantages of the invention are illustrated by the following examples. However, the particular materials and amounts thereof recited in these examples, as well as other conditions and details, are to be interpreted to apply broadly in the art and should not be construed to unduly limit the invention.

EXAMPLES

The following materials are used in the Examples.

Dye 1

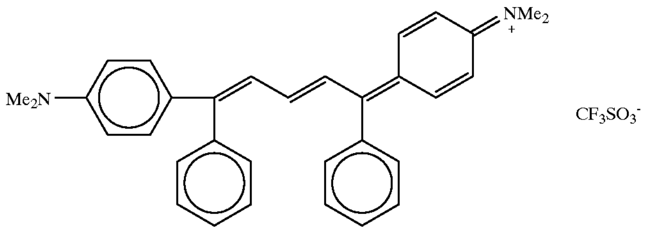

Dye 2

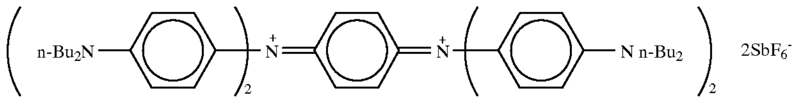

(Supplied under the trade name "CYASORB IR165" by American Cyanamid).

Compound 1(a)–1(e)

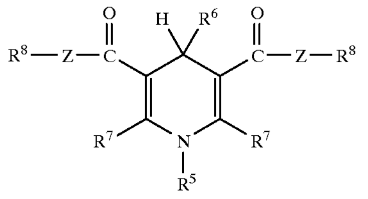

| | $R^5$ | $R^6$ | $R^7$ | $R^8$ | Z |
|---|---|---|---|---|---|
| 1(a) | H | Ph | Me | Et | O |
| 1(b) | Ph | Ph | Me | Et | O |
| 1(c) | H | 3,4-$(OH)_2C_6H_4$ | Me | Et | O |
| 1(d) | H | Ph | Me | Me | — |
| 1(e) | Me | Ph | Me | Et | O |

Bleaching agent B2 has the following structure wherein $R{=}CH_3$:

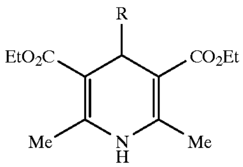

| | |
|---|---|
| BUTVAR B-76 | polyvinylbutyral resin supplied by Monsanto, with free OH content of 7 to 13 mole % |
| DISPERBYK 161 | dispersing agent supplied by BYK-Chemie |
| FC | N-methylperfluorooctanesulphonamide |
| MEK | methyl ethyl ketone (2-butanone) |
| PET | polyethyleneterephthalate film |
| VAGH and VYNS | vinyl copolymers resins supplied by Union Carbide |
| SCHOELLER 170M | proofing base supplied by Schoeller comprising silica particles (4 μm to 10 μm diameter) in a resin coating on paper |
| VIKING | grained and anodized aluminium |
| base | printing plate base, obtained by removing the |

-continued

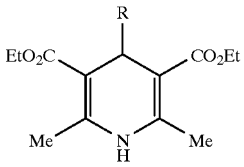

| | |
|---|---|
| | photosensitive coating from VIKING printing plates supplied by Imation |
| KODAK | receptor sheet supplied by Kodak as |
| APPROVAL | base part of the APPROVAL proofing system |

All coatings were made on untreated poly(ethylene terephthalate) (PET) base unless otherwise indicated, using wire-wound bars.

Example 1

This example demonstrates the photoreductive bleaching of Dyes 1 and 2 by Compound 1(a) (i.e., Donor 1(a)). The following formulations were coated on 100 micrometer unsubbed polyester base at 12 micrometer wet thickness and air dried to provide Elements 1–3:

| | Element 1 | Element 2 | Element 3(c) |
|---|---|---|---|
| BUTVAR B76 (10% w/w in MEK) | 2.75 g | 5.5 g | 5.5 g |
| MEK | 2.75 g | 3.5 g | 3.5 g |
| Ethanol | — | — | — |
| Dye 1 | 0.08 g | — | — |
| Dye 2 | — | 0.25 g | 0.25 g |
| Compound 1(a) | 0.4 g | 0.68 g | — |

Element 3 was the control as there was no donor present. Element 1 was pale blue/pink in appearance and Elements 2 and 3 pale grey. Samples measuring 5 cm×5 cm were mounted on a drum scanner and exposed by a 20 micrometer laser spot scanned at various speeds. The source was either a laser diode delivering 115 mW at 830 nm at the image plane (Element 1), or a YAG laser delivering 2 W at 1068 nm (Elements 2 and 3). The results are reported in the following table in which OD represents optical density:

| Element 1 | | |
|---|---|---|
| OD (830 nm) (initial) | 1.9 | |
| OD after 600 cm/sec scan | 1.7 | |
| OD after 400 cm/sec scan | 1.5 | |
| OD after 200 cm/sec scan | 0.7 | |
| | Element 2 | Element 3(c) |
| OD(1100 nm)(initial) | 1.3 | 1.3 |
| OD after 6400 cm/sec scan | 0.9 | 1.3 |
| OD after 3200 cm/sec scan | 0.6 | 1.1 |

In the case of Elements 1–2, colorless tracks were formed in the exposed areas, with the degree of bleaching correlating with scan speed, whereas Element 3 (a control lacking a donor compound) showed negligible bleaching.

The preparation and imaging of Element 1 was repeated, substituting Compounds 1(b)–1(d) for Compound 1(a), all of which function as photoreducing donors, giving similar results.

Example 2

The example demonstrates thermal transfer media in accordance with the invention. A millbase was prepared by dispersing 4 grams of magenta pigment chips in 32 grams of MEK using a McCrone Micronising Mill. The pigment chips were prepared by standard procedures and comprised blue shade magenta pigment and VAGH binder in a weight ratio of 3:2. The following formulations were prepared and coated as described in Example 1 (except the FC was added after the other ingredients had been mixed for 30 minutes under low light conditions) to give Elements 4–7.

| | Element 4 | Element 5(c) | Element 6 | Element 7(c) |
|---|---|---|---|---|
| Millbase | 5.5 g | 5.5 g | 5.5 g | 5.5 g |
| MEK | 2.0 g | 2.0 g | 2.0 g | 2.0 g |
| Ethanol | 1.0 g | 1.0 g | 1.0 g | 1.0 g |
| Dye 1 | 0.125 g | 0.125 g | — | — |
| Dye 2 | — | — | 0.2 g | 0.2 g |
| Compound 1(a) | 0.6 g | — | 0.6 g | — |
| FC | 0.025 g | 0.025 g | 0.025 g | 0.025 g |

(c) = control without donor (not in accordance with invention)

Samples of the resulting coatings were assembled in contact with a VYNS-coated paper receptor and mounted on an external drum scanner with vacuum hold-down, then addressed with a laser diode (830 nm, 110 mW, 20 micrometer spot) scanned at 100 cm/second or 200 cm/second. The receptor sheets, after peeling from the donors, showed lines of magenta pigment contaminated to varying extents by Dye 1 or Dye 2. The degree of contamination was assessed by measuring the reflection density of the transferred tracks at 830 nm or 1050 nm as appropriate.

| | 200 cm/sec | 100 cm/sec |
|---|---|---|
| Element 4 | 0.3 | 0.1 |
| Element 5(c) | 0.8 | 0.6 |
| Element 6 | 0.8 | 0.4 |
| Element 7(c) | 1.5 | 1.4 |

The elements of the invention show much reduced contamination by the IR dye, and purer magenta images were obtained.

Example 3

This example demonstrates the utility of the invention in colorant transfer imaging. The following ingredients were mixed for 1 hour at room temperature to give a homogeneous solution (all parts by weight):

| | |
|---|---|
| BUTVAR B-76 (15 wt % soln. in MBK) | 20.5 |
| Dye D1 | 0.9 |
| Compound 1(b) | 1.2 |
| N-methylperfluorooctanesulphonamide | 0.3 |
| Ethanol | 7.5 |
| MEK | 40.05 |

A portion (11.7 parts) of the resulting solution was mixed with 2.5 parts of a cyan pigment dispersion and 1.8 parts of MEK for 10 minutes, then coated on 100 μm PET at 36 μm wet thickness and dried for 3 minutes at 60° C. Cyan pigment (Sun 249-0592) was predispersed in BUTVAR B76 (3:2 pigment:binder, by weight) in accordance with standard procedures, and supplied in the form of chips. The pigment dispersion was obtained by milling 6 parts cyan pigment chips with 34 parts MEK for 1 hour in a McCrone Micronising Mill.

The resulting laser-sensitive cyan colorant donor sheet had a reflection OD of 1.2 at 830 nm from the IR dye, and a cyan OD of 1.0.

A sample of RAINBOW receptor sheet (supplied by Minnesota Mining and Manufacturing Company) was washed with acetone to remove its resin coating, and then was coated at 36 μm wet thickness with a solution of BUTVAR B-76 (10 parts) and Bleaching Agent B2 of the invention (5 parts) in MEK (85 parts), and dried for 3 minutes at 60° C.

Samples of the donor and receptor were assembled in face-to-face contact on the drum of a laser scanner equipped with a 220 mW laser diode emitting at 830 nm. The laser beam, focused to a 23 μm diameter spot, was scanned over the assembly at varying speeds in the range 200–500 cm/second and was modulated in accordance with a test pattern corresponding to 1–99% dots from a 150 line screen. A high quality half-tone pattern was transferred to the receptor at all scan rates, except that the cyan image was contaminated by residual absorption from the IR dye (OD 0.8 at 830 nm). However, when the image-bearing receptor was placed in an oven at 140° C. for 5 minutes, the 830 nm absorption disappeared completely, without affecting the cyan absorption.

The imaging process was repeated, using uncoated paper as the receptor. As before, a high quality half-tone pattern was transferred, but the cyan image was contaminated by residual absorption from the IR dye. A bleaching agent donor was prepared by coating a solution of BUTVAR B-76 (10 parts) and Bleaching Agent B2 of the invention (5 parts) in MEK (85 parts) on transparent PET base and drying 3 minutes at 60° C. The resulting donor was assembled in face-to-face contact with the image-bearing receptor and fed through a MATCHPRINT laminator (supplied by 3M Company) set at 140° C. The transparent PET sheet was peeled off, leaving behind the layer containing the bleaching agent. Some bleaching of the IR dye took place during the lamination process, but further heat treatment (3 minutes in an oven at 140° C.) completed the process, once again leaving the cyan absorption unaffected.

Example 4

This Example demonstrates the crosslinking of BUTVAR B-76 polyvinyl butyral in accordance with the invention. A solution of BUTVAR B-76 resin (7.5 wt %) in MEK was prepared, and to each of 3 separate 5.0 gram aliquots was added 0.1 gram of infrared dye Dye 1 and a further 1.0 gram of MEK, together with a test compound as follows:

| | |
|---|---|
| (a) (control) | none |
| (b) (invention) | latent curing agent (Compound 1(b)) |
| (c) (invention) | latent curing agent (Compound 1(e)) |

The resulting solutions were bar coated at 36 μm wet thickness on PET base and dried for 3 minutes at 60° C. Each coating was exposed on an external drum scanner equipped with a 116 mW diode laser emitting at 830 nm and focused to a 20 μm spot, the scan rate being varied in the range 100 cm/second to 400 cm/second. The imaged coatings were placed in an oven at 130° C. for 3 minutes, then developed in acetone to remove uncured areas of the coatings. Images were observed as follows:

| | |
|---|---|
| (a) (control) | traces of image for 100 cm/second scan |
| (b) (invention) | tough, well-defined image for 100 cm/second scan |
| (c) (invention) | tough, well-defined image for 200 cm/sec scan |

The results clearly demonstrate the effectiveness of Compound 1(b) and Compound 1(e) as latent curing agents.

Example 5

This Example demonstrates pigmented transfer media in accordance with the invention. In the following formulations, all parts are by weight.

A magenta millbase was prepared by milling pigment (360 parts) with BUTVAR B-76 resin (240 parts) in the presence of DISPERBYK 161 dispersing agent (101 parts) and I -methoxypropan-2-ol (100 parts) on a two-roll mill. The "chips" produced were dispersed in a 1:1 mixture (by weight) of MEK and 1-methoxypropan-2-ol to provide a millbase comprising 15% solids (by weight).

To 400 parts of millbase was added 260 parts of 15 wt % BUTVAR B-76 resin in MEK, 1480 parts of additional MEK, 36 parts of infrared dye Dye 1, 36 parts latent curing agent (Compound 1(b)), and 180 parts ethanol. After stirring to allow the dye to dissolve, 7.2 parts of N-methylperfluorooctylsulphonamide was added, and the mixture bar coated on 50 μm PET base to provide a thickness of about 1 μm after drying at 93° C.

A control donor sheet was prepared similarly, but omitting the latent curing agent (Compound 1(b)).

A sample of each donor sheet was mounted in face-to-face contact with a receptor sheet (comprising a layer of BUTVAR B-76 resin coated on a paper base) on an external drum scanner, and scanned at 300 cm/second with a diode laser delivering 220 mW at 830 nm, focused to a 20 μm spot. Separation of the donors and receptors revealed magenta images on the receptors corresponding to the laser tracks. Each image-bearing receptor was cut in half, and one half place in an oven at 160° C. for 3 minutes. Inspection of the unheated images revealed that both were relatively soft and easily damaged, e.g., with a fingernail. Inspection of the heated images revealed that those obtained from the control donor sheet were still soft and easily damaged, whereas that obtained from the donor sheet of the invention was hard and abrasion resistant.

Example 6

This Example demonstrates the effect on image quality of varying the surface topography of the receptor layer.

The colorant donor sheet used in this Example comprised the following, as a layer on PET base of approximately 1 μm dry thickness in which all percentages are by weight:

| | |
|---|---|
| magenta pigment | 23.2% |
| BUTVAR B-76 | 48.6% |
| IR Dye D1 | 9.0% |
| Curing Agent (Compound 1(b)) | 15.2% |
| N-ethylperfluorooctylsulfonamide | 4.0% |

Samples of the donor sheet were mounted face-to-face with samples of various receptor sheets with vacuum hold down on an exposure test bed comprising a fibre-coupled laser diode (500 mW, 870 nm) focused to a 30 μm spot. A half tone dot pattern was imaged on to each receptor under identical conditions of laser power and scan rate, and the quality of each of the transferred images assessed both microscopically (for dot quality) and visually (for overall appearance). The following receptor sheets were tested:

(a) Kodak APPROVAL receptor;

(b) an ink jet receptor comprising a coating on paper of starch particles (approximately 500/mm$^2$, at least 10 μm diameter);

(c) Schoeller 170M base;

(d) a coating on vesicular polyester of silica particles (4 to 10 μm diameter, approximately 1500/mm$^2$) in BUTVAR B76 polyvinyl butyral resin;

(e) VIKING printing plate base; and (f) a smooth coating on paper of BUTVAR B76 polyvinyl butyral.

The results obtained are summarized in the following table:

| Receptor | Average Projection (μm) | Number per nm$^2$ | Average Number per pixel | Dot Quality | Visual Appearance |
|---|---|---|---|---|---|
| (a) comparison | about 20 | 100 | <1 | Very poor (much fragmentation) | Poor color saturation. No dust artefacts |
| (b) comparison | about 10 | 500 | <1 | Poor (fragmented) | Poor color saturation. No dust artefacts |
| (c) invention | 4 to 6 | 1500 | 1 to 2 | Good (film transfer) | Bright color. No dust artefacts. |
| (d) invention | 4 to 6 | 1500 | 1 to 2 | Good (film transfer) | Bright color. No dust artefacts. |
| (e) invention | <1 | >10000 | many | Excellent (film transfer) | Bright color. No dust artefacts. |
| (f) comparative | — | — | — | Excellent (film transfer) | Bright color. Dust artefacts. |

Receptors (a) and (b) gave diffuse images with poor color saturation, whereas receptors (c) to (f) all gave sharp images with bright, saturated color. Microscopic examination revealed that the dots transferred to receptors (a) and (b) had fragmented during the transfer process, with pigment scattered over a wide area, whereas the dots transferred to the other receptors were in the form of coherent films. The dots on receptors (c) and (d) showed some edge distortion, but those on receptors (e) and (f) had sharp edges. However, the image on receptor (f) suffered from "dropouts" caused by dust particles, whereas none of the other images suffered from this defect. Thus, it was concluded that a roughened receptor showing protrusions of on average less than 10 μm, and providing on average at least 1 point of contact per pixel between donor and receptor, is necessary for good quality images, free from dust artefacts. Receptor (e), illustrates the trend for improved image quality as the surface protrusions of the receptor layer become smaller and more numerous.

Example 7

Cyan, magenta, yellow and black (CMYK) donor sheets were prepared as in Example 6 with weight percentages of components listed in the following Table in the transfer material coated at about 1 μm to SWOP specifications for web off-set printing.

Exposure using Presstek PEARLSETTER 74 running at various scan rates (100 to 500 cm/second) and laser power of 500 mW, 30 micrometer, 870 nm, transfer was effected in the order C, M, Y, K to Schoeller 170M base, the donor-receptor being held in tension together. Blocks of color (10×20 $mm^2$) were imaged over a range of scan speeds (100 to 500 cm/second). A second set from a different color were directly overprinted the first at same scan speed.

Successful overprint of C, M, Y, K was achieved with no defects observable over an A2 imaging area, over all scanning speed (100 to 500 cm/second).

| Millbases: | |
|---|---|
| Red Shade Cyan Millbase | |
| Red Shade Cyan Pigment | 7.77 g |
| BUTVAR B76 | 7.77 g |
| DISPERSBYK 161 | 0.47 g |
| MEK | 42.0 g |
| 1-methoxy-2-propanol | 42.0 g |
| Phthalo Green Millbase | |
| Phthalo Green Pigment | 7.86 g |
| BUTVAR B76 | 7.86 g |
| DISPERSBYK 161 | 0.47 g |
| MEK | 41.9 g |
| 1-methoxy-2-propanol | 41.9 g |
| Red Shade Magenta Millbase | |
| Red Shade Magenta Pigment | 7.78 g |
| BUTVAR B76 | 7.78 g |
| DISPERSBYK 161 | 0.93 g |
| MEK | 41.8 g |
| 1-methoxy-2-propanol | 41.8 g |
| Blue Shade Magenta Millbase | |
| Blue Shade Magenta Pigment | 7.36 g |
| BUTVAR B76 | 7.36 g |
| DISPERSBYK 161 | 0.88 g |
| MEK | 42.2 g |
| 1-methoxy-2-propanol | 42.2 g |
| Black Millbase | |
| Carbon Black Pigment | 9.88 g |
| BUTVAR B76 | 9.88 g |
| DISPBRSBYK 161 | 1.03 g |
| MEK | 39.6g |
| 1-methoxy-2-propanol | 39.6 g |
| Green Shade Yellow Millbase | |
| Green Shade Yellow Pigment | 7.28 g |
| BUTVAR B76 | 7.28 g |
| DISPERSBYK 161 | 0.44 g |
| MEK | 42.5 g |
| 1-methoxy-2-propanol | 42.5 g |
| Red Shade Yellow Millbase | |
| Red Shade Yellow Pigment | 7.28 g |
| BUTVAR B76 | 7.28 g |
| DISPERSBYK 161 | 0.44 g |
| MEK | 42.5 g |
| 1-methoxy-2-propanol | 42.5 g |

| | Cyan (wgt. in grams) | Magenta (wgt. in grams) | Yellow (wgt. in grams) | Black (wgt. in grams) |
|---|---|---|---|---|
| Red Shade Cyan Millbase (16% solids in MEK) | 12.05 | | | 5.16 |
| Phthalo Green Millbase (16.2% solids in MEK) | 1.48 | | | |
| Red Shade Magenta Millbase (16.5% solids in MEK) | | 20.18 | | |
| Blue Shade Magenta Millbase (15.6% solids in MEK) | | 22.02 | | 1.51 |
| Carbon Black Millbase (20.8% solids in MEK) | | 0.15 | | 20.09 |

-continued

| | Cyan (wgt. in grams) | Magenta (wgt. in grams) | Yellow (wgt. in grams) | Black (wgt. in grams) |
|---|---|---|---|---|
| Green Shade Yellow Millbase (15% solids in MEK) | | | 30.75 | |
| Red Shade Yellow Millbase (15% solids in MEK) | | | 2.69 | |
| BUTVAR B76 (15% solids in MEK; polyvinyl butyral, available form Monsanto) | 17.4 | 0.02 | 8.91 | 6.57 |
| IR Dye | 1.07 | 1.23 | 1.28 | 0.53 |
| Dihydropyridine | 0.39 | 0.61 | 0.51 | 0.45 |
| Fuorocarbon surfactant (7.5% solids in MEK) | 0.67 | 0.67 | 0.67 | 0.67 |
| Fluorocarbon polymer (50% solids in MEK) | 0.52 | 0.52 | 0.73 | 0.6 |
| Methyl ethyl ketone (MEK) | 50.09 | 44.98 | 55.14 | 56.41 |
| Ethanol | 9 | 9 | 9 | 9 |
| 1-methoxy-2-propanol | 8 | | | |

Example 8

A receptor was prepared by coating the following formulation from methylethyl ketone (18 wt %) onto 100 μm PET base to provide a dry coating weight of 400 mg/ft$^2$ (4.3 g/m$^2$):

| | |
|---|---|
| PLIOLITE S5A | 87 wt % |
| Poly(stearyl methacrylate) beads (8μ diameter) | 1 wt % |
| Diphenylguanidine | 12 wt % |

The receptor was imaged under the conditions of Example 7 using the cyan, magenta, yellow and black donor sheets. The resulting image was transferred to opaque MATCHPRINT Low Gain base under heat and pressure by passing the receptor and base in contact through a MATCHPRINT laminator. The sheets were peeled apart and the transferred image inspected. The quality of the transferred image was excellent, having good color rendition with no contamination from the IR dye. No dust artefacts were apparent.

The complete disclosure of all patents, patent documents, and publications cited herein are incorporated by reference. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

What is claimed is:

1. A laser-induced thermal imaging system comprising:

a donor element comprising a substrate on which is coated transfer material comprising:
- a binder comprising a hydroxylic resin;
- a fluorocarbon additive;
- a cationic infrared absorbing dye;
- a latent crosslinking agent having the following formula:

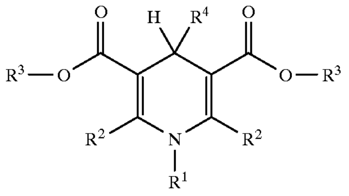

wherein $R^1$ is selected from the group of H, an alkyl group, a cycloalkyl group, and an aryl group;
each $R^2$ and $R^3$ is independently an alkyl group or an aryl group; and
$R^4$ is an aryl group;
- a dispersible material; and a receptor element comprising a texturized surface.

2. The laser-induced thermal imaging system of claim 1 wherein the transfer material of the donor element comprises one layer of material.

3. The laser-induced thermal imaging system of claim 1 wherein the binder of the transfer material further comprises a noncrosslinkable resin.

4. The laser-induced thermal imaging system of claim 1 which produces a transferred image having a resolution of at least about 300 dots per inch.

5. The laser-induced thermal imaging system of claim 4 which produces a transferred image having a resolution of at least about 1000 dots per inch.

6. The laser-induced thermal imaging system of claim 5 which produces a transferred image having a resolution of at least about 2000 dots per inch.

7. The laser-induced thermal imaging system of claim 1 which produces a transferred image at a sensitivity of no greater than about 0.5 Joule/cm$^2$.

8. The laser-induced thermal imaging system of claim 1 wherein the cationic infrared absorbing dye is a bleachable dye.

9. The laser-induced thermal imaging system of claim 8 wherein the bleachable cationic infrared absorbing dye is selected from the group of a tetraarylpolymethine dye, an amine cation radical dye, and mixtures thereof.

10. The laser-induced thermal imaging system of claim 9 wherein the bleachable cationic infrared absorbing dye is a tetraarylpolymethine dye.

11. The laser-induced thermal imaging system of claim 10 wherein the tetraarylpolymethine dye has the formula:

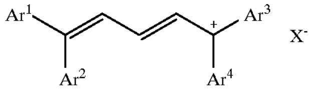

wherein each $Ar^1$ to $Ar^4$ are aryl groups that are the same or different and at least one of the aryl groups represented by $Ar^1$ to $Ar^4$ has a tertiary amino substituent, and X is an anion.

12. The laser-induced thermal imaging system of claim 11 wherein the tetraarylpolymethine dye is

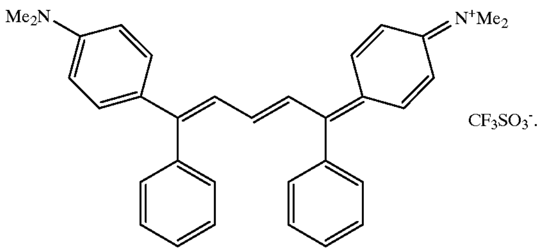

13. The laser-induced thermal imaging system of claim 1 wherein the latent crosslinking agent has the following structure:

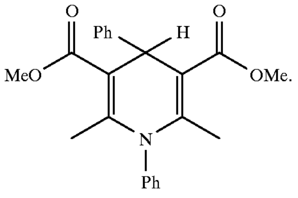

14. The laser-induced thermal imaging system of claim 1 wherein the latent crosslinking agent has the following structure:

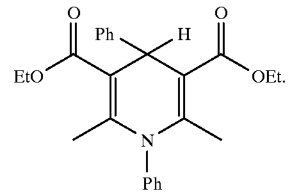

15. The laser-induced thermal imaging system of claim 1 wherein the receptor element comprises a substrate having a textured receiving layer surface comprising a plurality of protrusions projecting above the plane of the surface of the recieving layer by an average distance of about 1 $\mu$m to about 8 $\mu$m.

16. The laser-induced thermal imaging system of claim 1 wherein the fluorocarbon additive comprises a sulfonamido compound.

17. The laser-induced thermal imaging system of claim 16 wherein the fluorocarbon additive comprises $(C_8F_{17})SO_2NH(CH_2CH_3)$.

18. The laser-induced thermal imaging system of claim 1 wherein the fluorocarbon additive and dispersible material are present in a weight ratio of least about 1:10.

19. The laser-induced thermal imaging system of claim 1 wherein the dispersible material is selected from the group of a pigment, a crystalline nonsublimable dye, a color enhancing additive, a texturizing material, and mixtures thereof.

20. The laser-induced thermal imaging system of claim 19 wherein the dispersible material comprises a pigment.

21. The laser-induced thermal imaging system of claim 19 wherein the dispersible material comprises texturizing particles.

22. The laser-induced thermal imaging system of claim 1 wherein the receptor element comprises protrusions that project above the plane of the outer surface of the receptor by an average distance of no greater than about 8 micrometers.

23. The laser-induced thermal imaging system of claim 22 wherein there is on average at least about 500 of said protrusions per square millimeter.

24. The laser-induced thermal imaging system of claim 22 wherein the protrusions are formed from particulate material in a binder.

25. The laser-induced thermal imaging system of claim 24 wherein the particulate material comprises polymeric beads.

26. The laser-induced thermal imaging system of claim 25 wherein the polymeric beads are selected from the group of polymethylmethacrylate beads, polystearyl methacrylate beads, and mixtures thereof.

27. The laser-induced thermal imaging system of claim 1 wherein the receptor element comprises a receiving layer, wherein the receiving layer comprises a bleaching agent for the bleachable cationic infrared dye.

28. The laser-induced thermal imaging system of claim 27 wherein the bleaching agent comprises an amine or a salt that decomposes thermally to release an amine.

29. The laser-induced thermal imaging system of claim 28 wherein the bleaching agent comprises a guanidine, or salt thereof, having the following general formula:

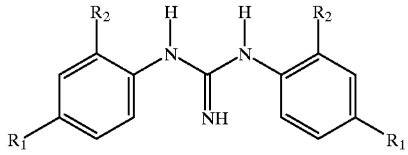

wherein each $R^1$ and $R^2$ is independently H or an organic group.

30. The laser-induced thermal imaging system of claim 29 wherein each $R^1$ and $R^2$ is independently H or an an alkyl group.

31. The laser-induced thermal imaging system of claim 27 wherein the bleaching agent comprises a 1,4-dihydropyridine of the following formula:

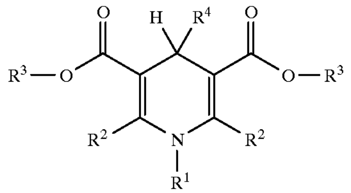

wherein:

$R^1$ is H or an organic group;

each $R^2$ and $R^3$ is an organic group; and $R^4$ is H or an alkyl group.

32. A laser-induced thermal imaging system comprising a donor element comprising a substrate on which is coated transfer material comprising:

a binder comprising a hydroxylic resin;

a fluorocarbon additive;

a tetraarylpolymethine dye of the formula:

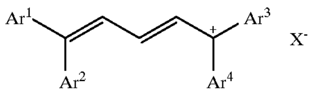

wherein each $Ar^1$ to $Ar^4$ are aryl groups that are the same or different and at least one of the aryl groups represented by $Ar^1$ to $Ar^4$ has a tertiary amino substituent, and X is an anion;

a latent crosslinking agent having the following formula:

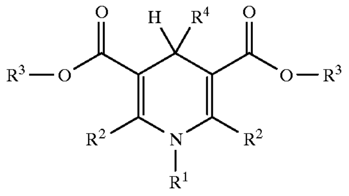

wherein $R^1$ is selected from the group of H, an alkyl group, a cyclolkyl group, and an aryl group;

each $R^2$ and $R^3$ is independently an alkyl group or an aryl group; and $R^4$ is an aryl group;

a pigment; and a receptor element comprising a substrate on which is coated a receiving layer, wherein the receiving layer comprises:

a bleaching agent for the tetraarylpolymethine dye;

a binder; and particulate material.

33. The laser-induced thermal imaging system of claim 32 wherein the bleaching agent comprises an amine or a salt that decomposes thermally to release an amine.

34. The laser-induced thermal imaging system of claim 33 wherein the bleaching agent comprises a guanidine, or salt thereof, having the following general formula:

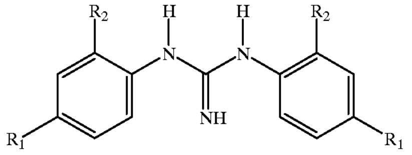

wherein each $R^1$ and $R^2$ is independently H or an organic group.

35. The laser-induced thermal imaging system of claim 32 wherein the particulate material comprises polymeric beads.

36. The laser-induced thermal imaging system of claim 35 wherein the polymeric beads are selected from the group of polymethylmethacrylate beads, polystyrene methacrylate beads, and mixtures thereof.

37. The laser-induced thermal imaging system of claim 32 wherein the tetraarylpolymethine dye is

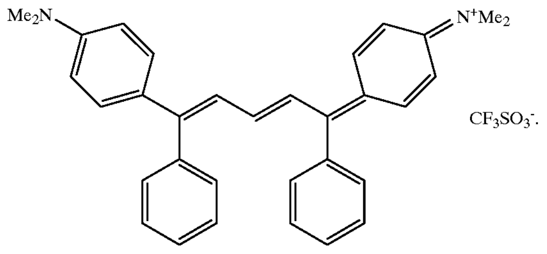

38. The laser-induced thermal imaging system of claim 32 wherein the latent crosslinking agent has the following structure:

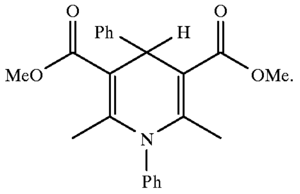

39. The laser-induced thermal imaging system of claim 32 wherein the latent crosslinking agent has the following structure:

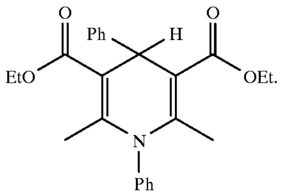

40. A method of imaging comprising:

(a) providing a laser thermal transfer donor element comprising a substrate on which is coated transfer material comprising:

a binder comprising a hydroxylic resin;

a fluorocarbon additive;

a cationic infrared absorbing dye;

a latent crosslinking agent having of the following formula:

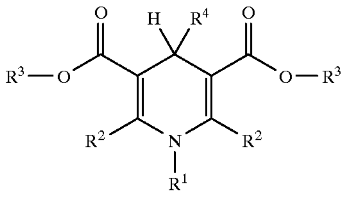

wherein $R^1$ is selected from the group of H, an alkyl group, a cycloalkyl group, and an aryl group;

each $R^2$ and $R^3$ is independently an alkyl group or an aryl group; and $R^4$ is an aryl group;

a dispersible material;

(b) providing a receptor element having texturized surface;

(c) assembling the donor element in contact with the receptor element and exposing the assembly to scanned laser radiation of a wavelength absorbed by the cationic infrared absorbing dye, said laser radiation being modulated in accordance with digitally stored image information, thereby transferring portions of the transfer material from the donor element to the receptor element; and (d) separating the donor element and receptor element, leaving an image residing on the receptor element.

41. The method of claim 40 wherein steps (a)–(d) form a cycle which is repeated at least once, wherein a different donor element comprising a different colorant is used in each repetition of the cycle, but the same receptor element is used in each repetition of the cycle.

42. The method of claim 40 wherein the bleachable cationic infrared absorbing dye comprises a tetraarylpolymethine dye having the of formula:

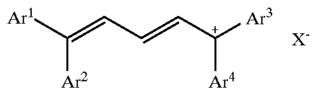

wherein each $Ar^1$ to $Ar^4$ are aryl groups that are the same or different and at least one of the aryl groups represented by $Ar^1$ to $Ar^4$ has a tertiary amino substituent, and X is an anion.

43. The method of claim 42 wherein the tetraarylpolymethine dye is

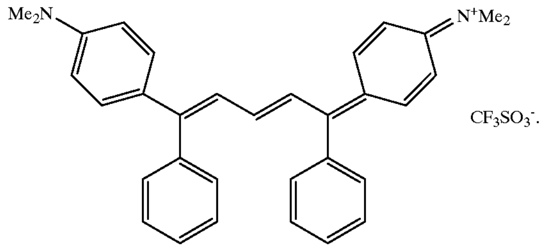

44. The method of claim 40 wherein the receptor element comprises a bleaching agent for the bleachable cationic infrared dye.

45. A method of imaging comprising:

(a) providing a laser thermal transfer donor element comprising a substrate on which is coated transfer material comprising:

a binder comprising a hydroxylic resin;

a fluorocarbon additive;

a cationic infrared absorbing dye;

a latent crosslinking agent having of the following formula:

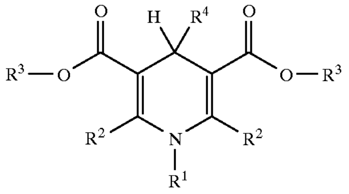

wherein $R^1$ is H or an organic group;

each $R^2$ and $R^3$ is an organic group; and $R^4$ is an aryl group; and a dispersible material;

(b) providing a receptor element having texturized surface;

(c) assembling the donor element in contact with the receptor element and exposing the assembly to scanned laser radiation of a wavelength absorbed by the cationic infrared absorbing dye, said laser radiation being modulated in accordance with digitally stored image information, thereby transferring portions of the transfer material from the donor element to the receptor element;

(d) separating the donor element and receptor element, leaving an image residing on the receptor element; and (e) subjecting the receptor and image residing thereon to heat treatment.

46. The method of claim 41 wherein the image residing on the receptor after all the repetitions of steps (a)–(d) is transferred to another receptor as a final step.

47. A method of imaging comprising:

(a) providing a laser thermal transfer donor element comprising a substrate on which is coated transfer material comprising:

a binder comprising a hydroxylic resin;

a fluorocarbon additive;

a cationic infrared absorbing dye;

a latent crosslinking agent having of the following formula:

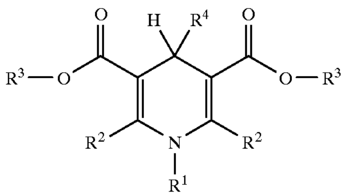

wherein $R^1$ is selected from the group of H, an alkyl group, a cycloalkyl group, and an aryl group;

each $R^2$ and $R^3$ is independently an alkyl group or an aryl group; and $R^4$ is an aryl group;

a dispersible material;

(b) providing a receptor element having texturized surface;

(c) assembling the donor element in contact with the receptor element and exposing the assembly to scanned laser radiation of a wavelength absorbed by the cationic infrared absorbing dye, said laser radiation being focused to a spot of area A $\mu m^2$ at the plane of the transfer material and being modulated in accordance with digitally half tone image information, thereby causing exposed portions of the colorant layer to soften or melt and adhere preferentially to the receptor element; and (d) separating the donor element and receptor element, leaving an image residing on the receptor element;

wherein the receptor element comprises a substrate having a textured receiving layer surface comprising a plurality of protrusions projecting above the plane of the surface of the receiving layer by an average distance no greater than about 8 μm, there being an average at least 1 protrusion per area of A $\mu m^2$.

48. A donor element comprising a substrate on which is coated transfer material comprising:

a binder comprising a hydroxylic resin;

a fluorocarbon additive;

a cationic infrared absorbing dye;

a latent crosslinking agent having a nucleus of the following formula:

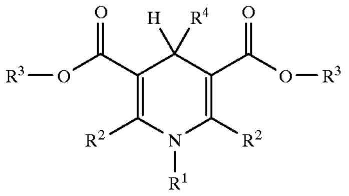

wherein $R^1$ is selected from the group of H, an alkyl group, a cycloalkyl group, and an aryl group;

each $R^2$ and $R^3$ is independently an alkyl group or an aryl group; and $R^4$ is an aryl group; a dispersible material.

* * * * *

UNITED STATES PATENT AND TRADEMARK OFFICE

CERTIFICATE OF CORRECTION

PATENT NO. : 5,935,758
DATED : August 10, 1999
INVENTOR(S) : Patel et al.

It is certified that error appears in the above-identified patent and that said Letters Patent is hereby corrected as shown below:

Title page,
Inventors:, "Gregory L. Zwaldo" should be -- Gregory L. Zwadlo --.

Under FOREIGN PATENT DOCUMENTS, please add:
-- 0 738 609 10/1996 European Pat. Off. .......B41M 5/28 --.

Under OTHER PUBLICATIONS, please add: -- H. Kim et al., "Molecular dynamics simulation of nanoscale thermal conduction and vibrational cooling in a crystalline naphthalene cluster", J. Chem. Phys., 94 8203-8209 (1991) --.

Page 2, under FOREIGN PATENT DOCUMENTS,
Please add -- 04-189189 Japan..........B41M 5/40 --.
Approximately line 18, "54-1589" should be -- 64-1589 --.

Column 2,
Line 13, "effect" should be -- affect --.

Column 29,
Line 33, "l - methoxypropan-2-ol" should be -- 1-methoxypropan-2-ol --.

Column 35,
Line 57, "recieving" should be -- receiving --.

UNITED STATES PATENT AND TRADEMARK OFFICE
CERTIFICATE OF CORRECTION

PATENT NO. : 5,935,758
DATED : August 10, 1999
INVENTOR(S) : Patel et al.

It is certified that error appears in the above-identified patent and that said Letters Patent is hereby corrected as shown below:

Column 36,
Line 49, "or an an alkyl" should be -- or an alkyl --.

Column 39,
Line 22, "the of formula" should be -- the formula --.

Signed and Sealed this

Thirtieth Day of October, 2001

Attest:

Nicholas P. Godici

NICHOLAS P. GODICI

*Attesting Officer* *Acting Director of the United States Patent and Trademark Office*